US008287289B2

(12) United States Patent
Niitsu et al.

(10) Patent No.: US 8,287,289 B2
(45) Date of Patent: Oct. 16, 2012

(54) ELASTIC-CUSHIONED CAPACITIVELY-COUPLED CONNECTOR

(75) Inventors: Toshihiro Niitsu, Tokyo (JP); Masako Nishikawa, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/997,313

(22) PCT Filed: Apr. 28, 2009

(86) PCT No.: PCT/US2009/041960
§ 371 (c)(1),
(2), (4) Date: Mar. 14, 2011

(87) PCT Pub. No.: WO2009/151806
PCT Pub. Date: Dec. 17, 2009

(65) Prior Publication Data
US 2011/0189867 A1    Aug. 4, 2011

(30) Foreign Application Priority Data

Jun. 10, 2008  (JP) .................................. 2008-151765
Jun. 10, 2008  (JP) .................................. 2008-151767

(51) Int. Cl.
 *H01R 12/61*    (2006.01)
(52) U.S. Cl. ....................................................... 439/66
(58) Field of Classification Search ............... 439/74, 439/660, 66; 361/773, 785
See application file for complete search history.

(56) References Cited

U.S. PATENT DOCUMENTS

| | | | |
|---|---|---|---|
| 4,144,485 A * | 3/1979 | Akita | 307/134 |
| 4,647,126 A * | 3/1987 | Sobota, Jr. | 439/74 |
| 6,612,852 B1 * | 9/2003 | Panella | 439/70 |
| 6,657,866 B2 * | 12/2003 | Morelock | 361/719 |
| 6,813,163 B2 * | 11/2004 | Inoue et al. | 361/784 |
| 7,112,069 B2 * | 9/2006 | Sandoval et al. | 439/74 |
| 7,511,523 B2 * | 3/2009 | Chen et al. | 324/755.01 |
| RE41,473 E * | 8/2010 | Hirata et al. | 439/74 |
| 7,811,135 B2 * | 10/2010 | Idzik et al. | 439/629 |
| 2001/0041465 A1 | 11/2001 | Szalay et al. | |
| 2002/0196614 A1 * | 12/2002 | DiBene et al. | 361/803 |
| 2004/0080921 A1 * | 4/2004 | Paola | 361/785 |
| 2005/0101164 A1 | 5/2005 | Rathburn | |
| 2005/0176301 A1 | 8/2005 | Barr | |
| 2006/0022336 A1 | 2/2006 | Franzon et al. | |

FOREIGN PATENT DOCUMENTS

| | | |
|---|---|---|
| EP | 0 649 193 A1 | 4/1995 |
| JP | 2006-120511 | 5/2006 |
| JP | 2008-262828 | 10/2008 |

OTHER PUBLICATIONS

International Search Report for PCT/US2009/041960.

* cited by examiner

*Primary Examiner* — Alexander Gilman
(74) *Attorney, Agent, or Firm* — Timothy M. Morella

(57) ABSTRACT

A connector according to the present invention is equipped with an elastic member with elasticity, at least one terminal including a connecting conductor portion formed on one side of the elastic member and connected to a circuit side conductor portion electrically continuous with a circuit provided on a first flat circuit substrate, a first opposing conductor portion formed on another side of the elastic member and opposed to a second opposing conductor portion electrically continuous with a circuit provided on a second flat circuit substrate, and a linking conductor portion linking the connecting conductor portion and the first opposing conductor portion with each other so as to allow them to make relative movement, and a dielectric portion formed at least on one of the first opposing conductor portion 25a and the second opposing conductor portion.

19 Claims, 18 Drawing Sheets

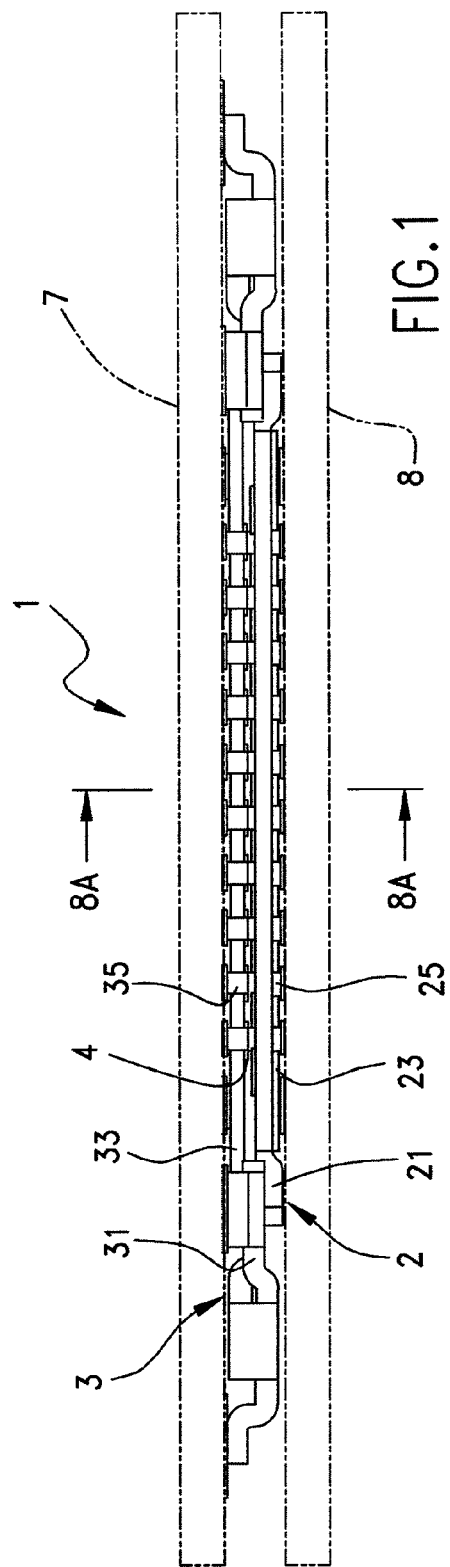
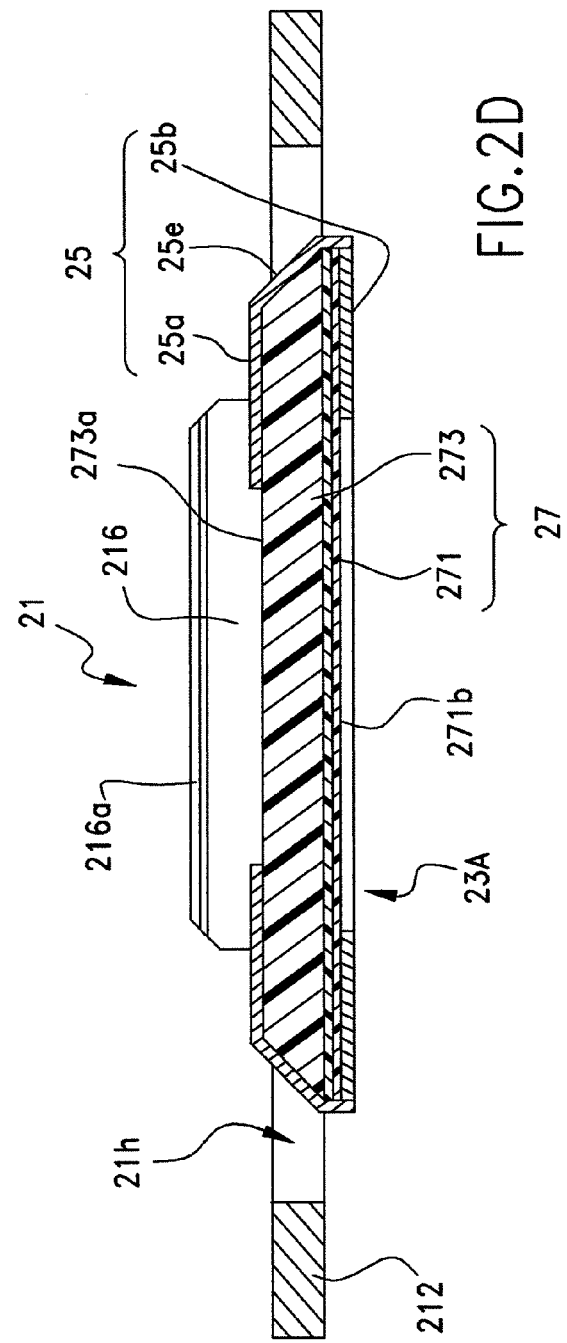

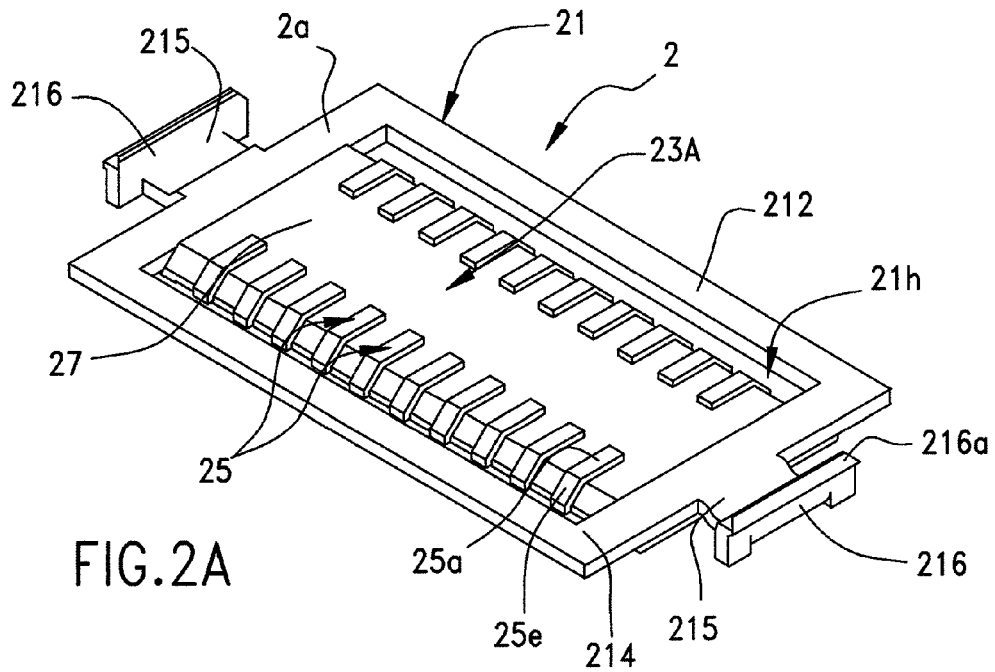
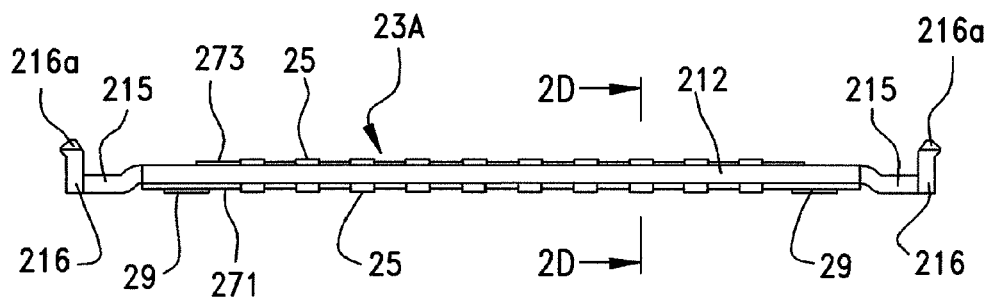
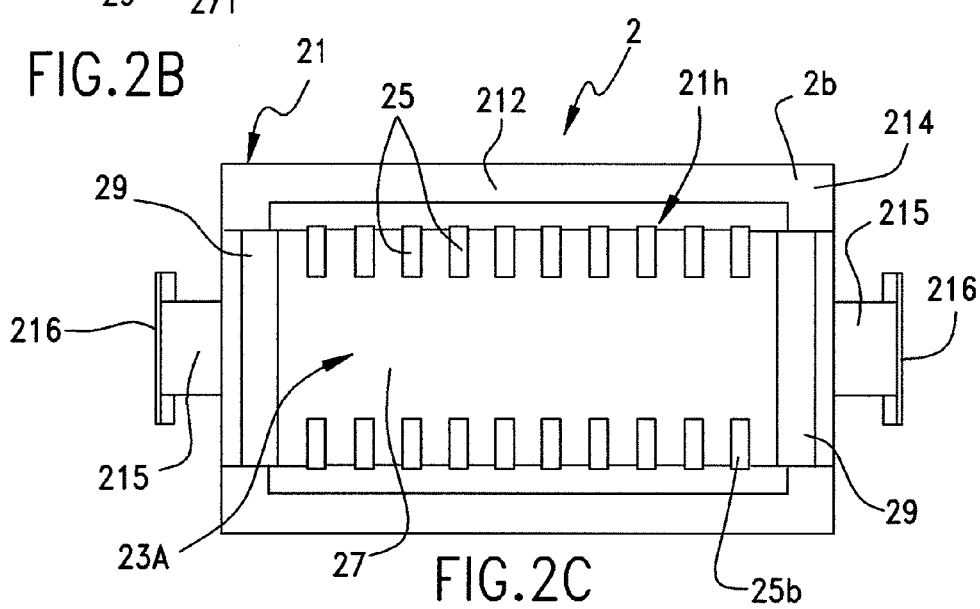

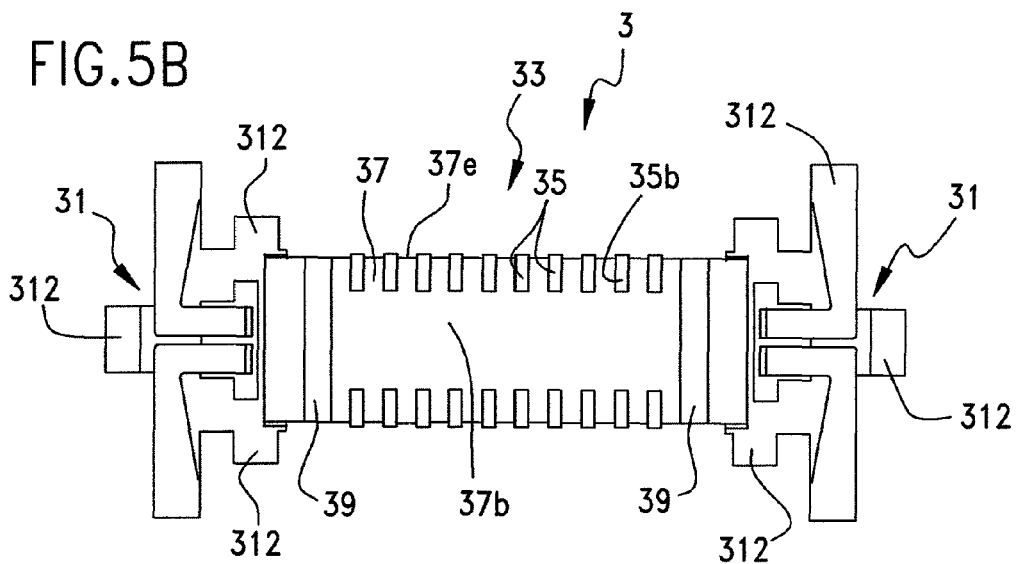
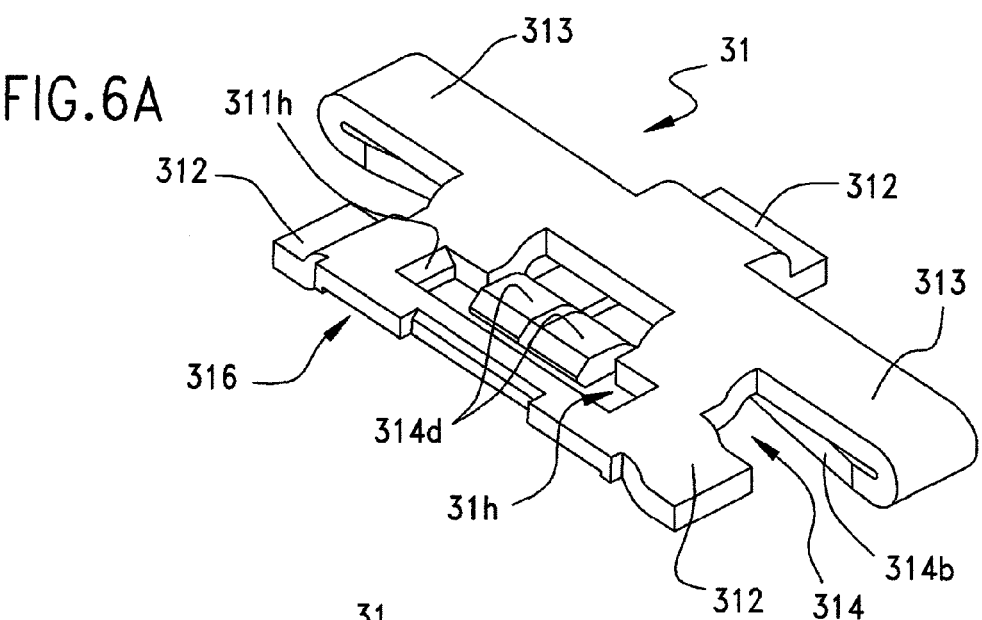
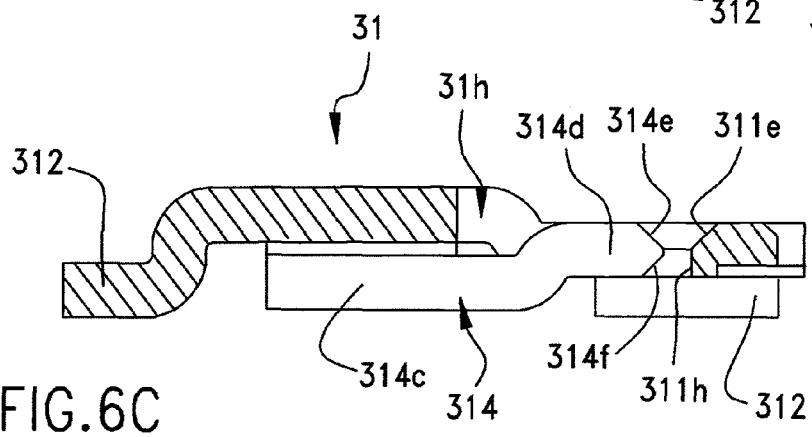

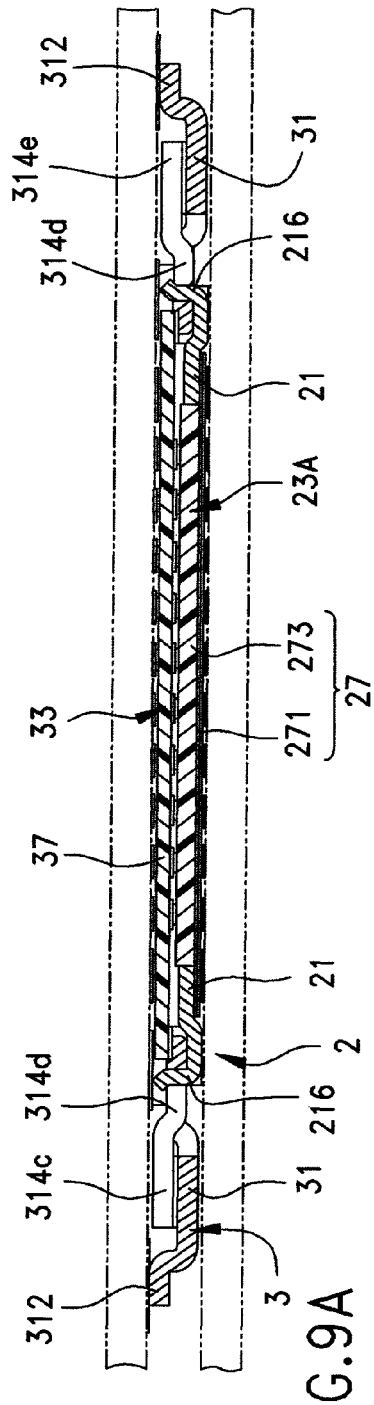
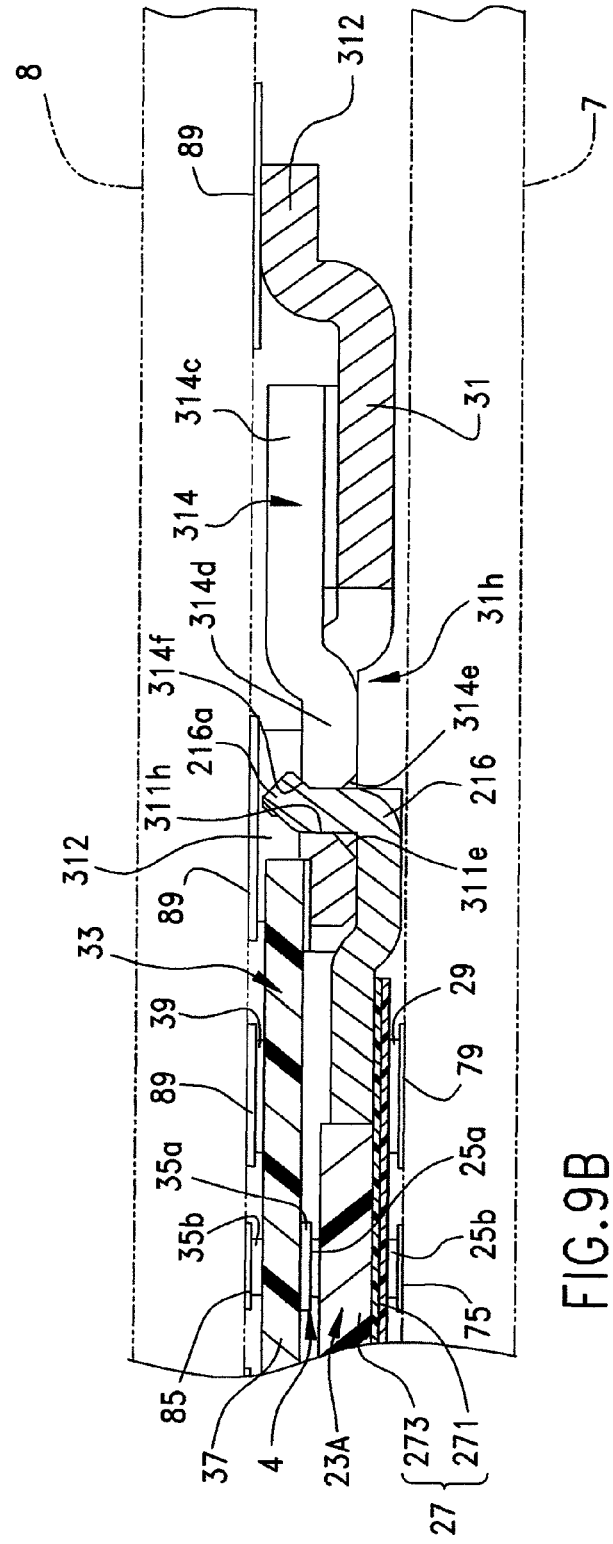
FIG.9A
FIG.9B

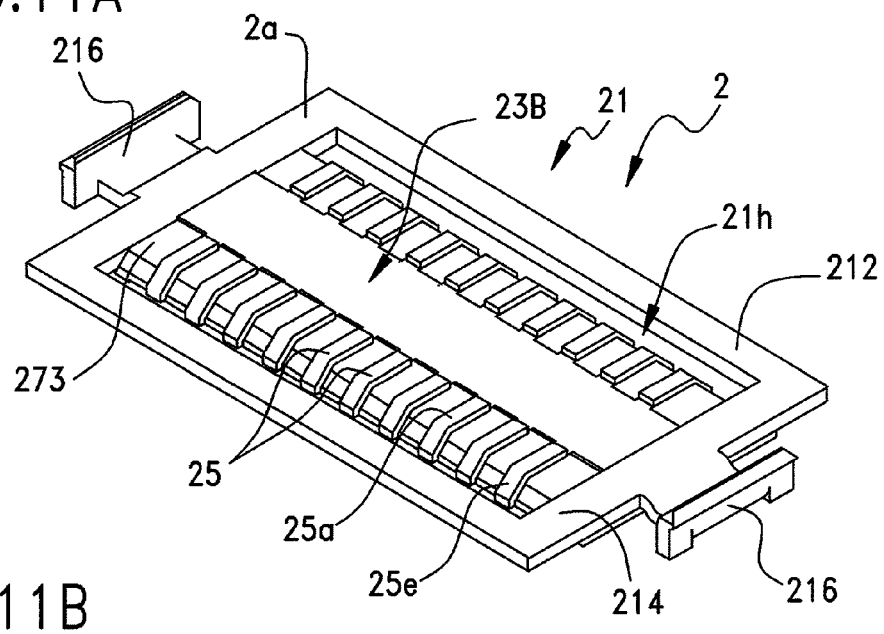
FIG.11A
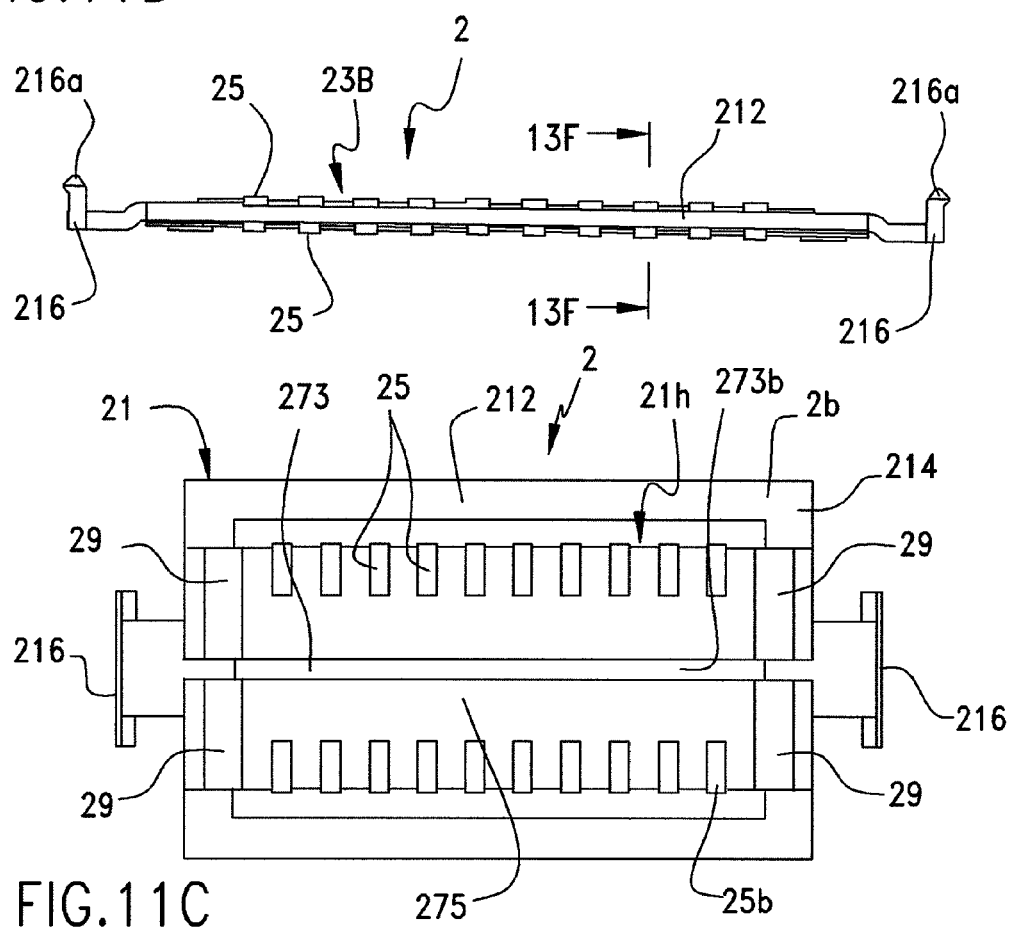
FIG.11B
FIG.11C

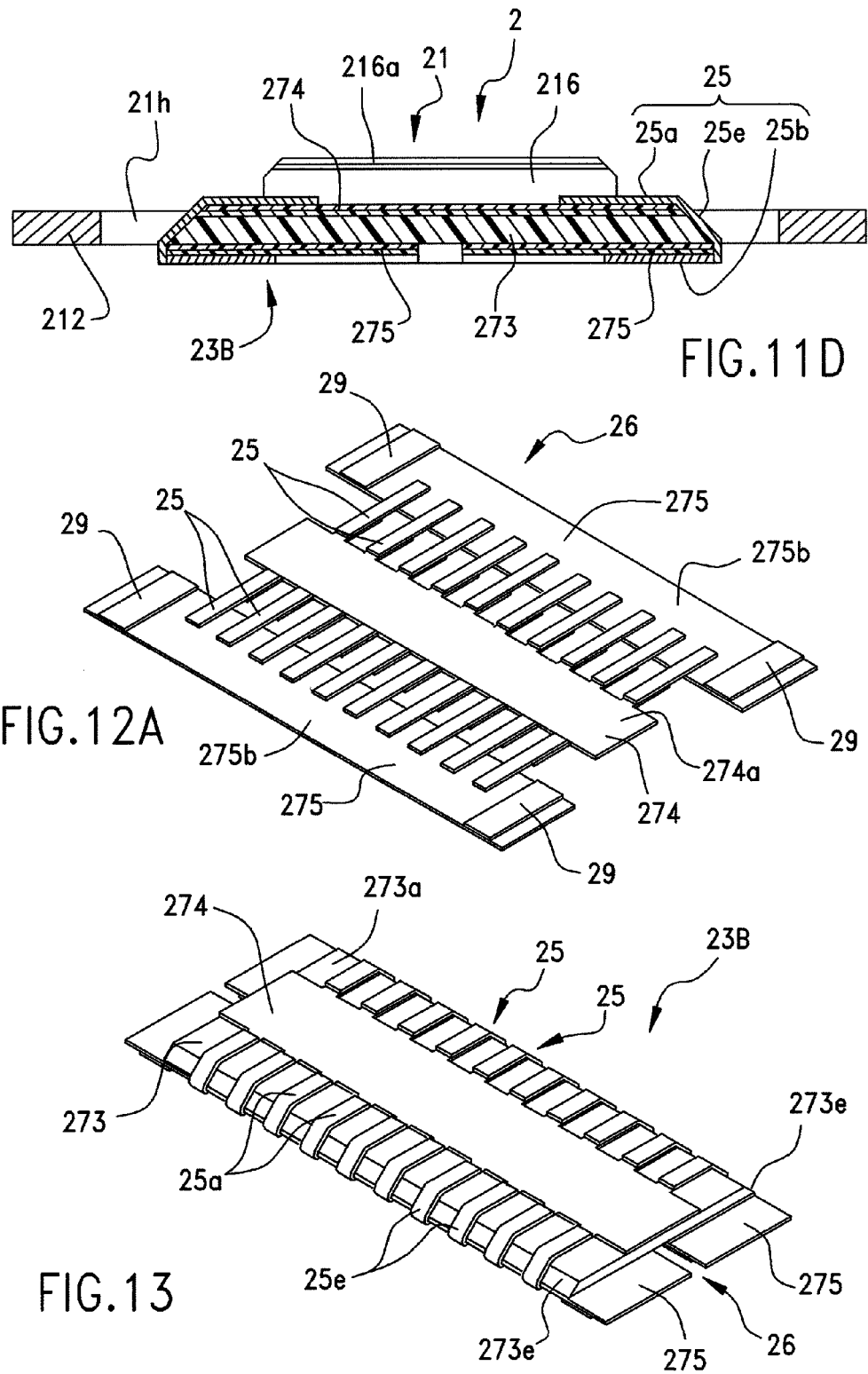

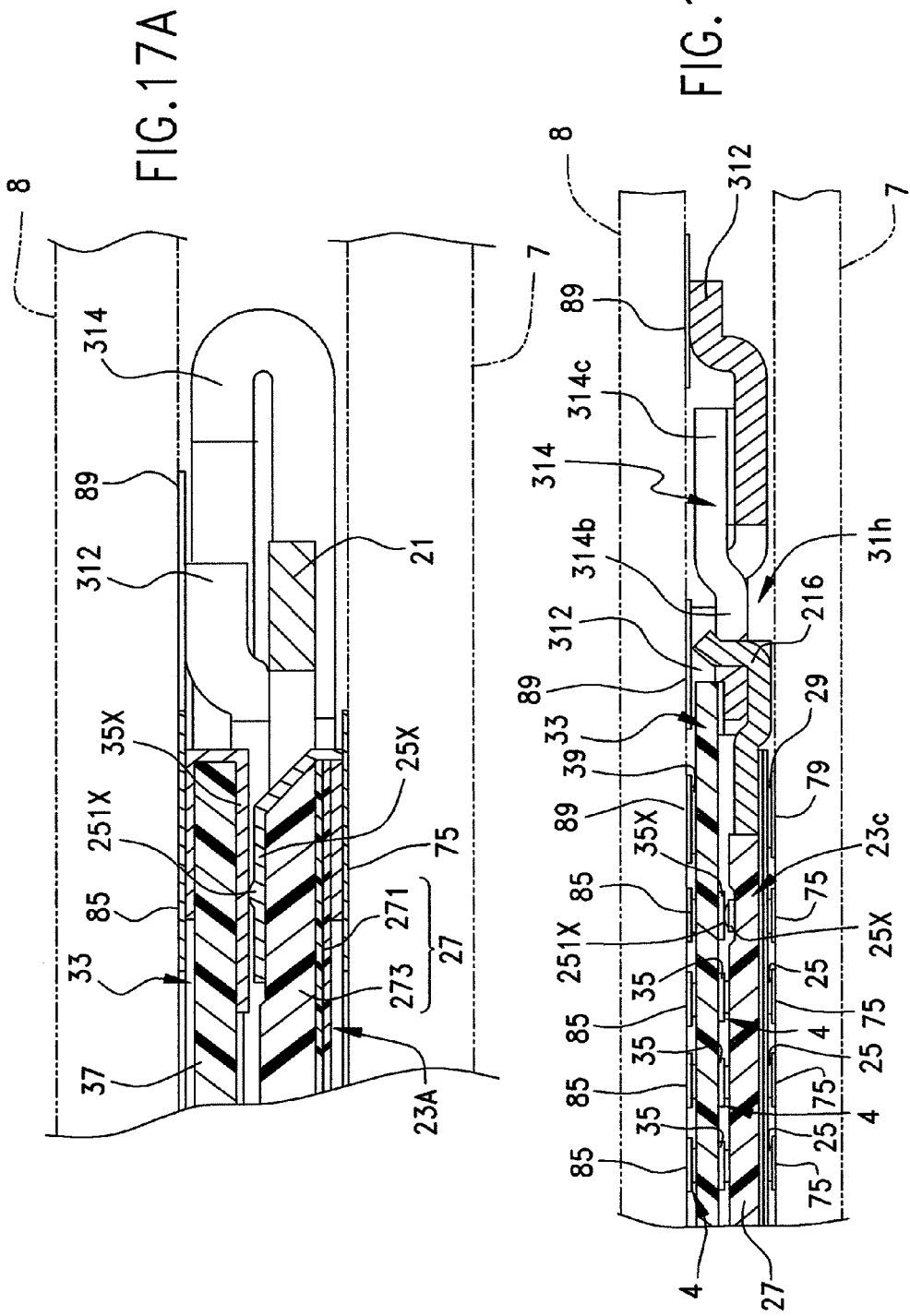

US 8,287,289 B2

ELASTIC-CUSHIONED CAPACITIVELY-COUPLED CONNECTOR

BACKGROUND OF THE INVENTION

The present invention relates to a connector and a terminal holder, and more particularly, to a connector utilizing capacitive-coupling to transfer signals within the structure of a connector.

In recent years, electronic apparatuses have been increased in frequency, and, as a result, non-contact signal transmission is required of a connector for use in electronic apparatuses. Known examples of such non-contact signal transmission include signal transmission through capacitive-coupling and signal transmission through electromagnetic induction.

To this point, Japanese Patent Application No. JP 2002-289309 A discloses capacitive-coupling terminals provided to one connector and terminals provided to another connector by opposing each other across a spatial interval. This patent application is an example in which a dielectric is disposed between the terminals opposed to each other across the spatial interval.

When arranging a dielectric between terminals, air or the like may be allowed to enter the gaps therebetween when the contact between the terminals and the dielectric is not sufficiently intimate. There is a dramatic difference in the capacitance between the terminals where the terminals and the dielectric are held in intimate contact with each other without involving any gaps and the case in which air or the like is allowed to enter the gaps therebetween and where the terminals and the dielectric are held together in such intimate contact, i.e. where air gaps may be present. In the connector art, it is desired to maintain the electrical characteristics of connectors for stability in signal transmission. There is hence a fear of a desired characteristic not being maintained where such contact may not be maintained in a capacitively-coupled connector.

The present invention has been made in view of the above-mentioned problem. It is accordingly a main object of the present invention to provide a connector and a terminal holder making it possible to suppress a change in capacitance between terminals.

SUMMARY OF THE INVENTION

In order to solve the above-mentioned problem a connector according to the present invention includes: a first frame mounted to a first flat circuit substrate; a second frame mounted to a second flat circuit substrate; an elastic member positioned with respect to the first frame and having elasticity in at least one predetermined direction; at least one terminal including a connecting conductor portion formed on one side in the one predetermined direction of the elastic member and connected to a circuit side conductor portion electrically continuous with a circuit provided on the first flat circuit substrate, a first opposing conductor portion formed on the another side in the one predetermined direction of the elastic member and opposed to a second opposing conductor portion electrically continuous with a circuit provided on the second flat circuit substrate, and a linking conductor portion linking the connecting conductor portion and the first opposing conductor portion so as to allow them relative movement in the one predetermined direction; and a dielectric portion formed on at least one of the first opposing conductor portion and the second opposing conductor portion, and is characterized in that, when the first frame and the second frame are attached together, the first opposing conductor portion and the second opposing conductor portion sandwich the dielectric portion therebetween.

Further, a terminal holder according to the present invention is characterized by including: an elastic member which has elasticity in at least one predetermined direction; and at least one terminal including a connecting conductor portion formed on one side in the one predetermined direction of the elastic member and connected to a circuit side conductor portion electrically continuous with a circuit provided on a first flat circuit substrate, a first opposing conductor portion formed on another side in the one predetermined direction of the elastic member and opposed to a second opposing conductor portion electrically continuous with a circuit provided on a second flat circuit substrate via a dielectric portion, and a linking conductor portion linking the connecting conductor portion and the first opposing conductor portion so as to allow them relative movement in the one predetermined direction, and characterized in that the terminal holder is pressed from the one side to the another side such that the first opposing conductor portion and the second opposing conductor portion sandwich the dielectric portion therebetween.

According to the present invention, the first opposing conductor portion and the second opposing conductor portion sandwiching the dielectric portion therebetween are pressed against the dielectric portion due to the elasticity of the elastic member, and hence intrusion of air or the like therebetween can be suppressed. As a result, it is possible to suppress a change in the capacitance between the first opposing conductor portion and the second opposing conductor portion.

According to the present invention, the elastic member for pressing the detachment prevention portion is capable of elastic deformation along the second flat circuit substrate, and hence it is possible to achieve a reduction in connector height.

According to an aspect of the present invention, the elastic member is formed as a plate whose thickness direction is the above-mentioned one predetermined direction, and the linking conductor portion links the connecting conductor portion and the first opposing conductor portion via an edge of the elastic member. With this construction, it is possible to suppress constraint of the relative movement in the thickness direction of the connecting conductor portion and the first opposing conductor portion.

Further, according to another aspect of the present invention, the elastic member includes a plate-like portion whose thickness direction is the one predetermined direction and a plate-like elastic body bonded to the plate-like portion. With this construction, it is possible to suppress the elasticity in an in-plane direction of the elastic body while maintaining the elasticity in the thickness direction of the elastic body, and hence it is possible to suppress positional deviation of the first opposing conductor portion and the second opposing conductor portion.

Further, according to this aspect, the connecting conductor portion may be formed of a first metal film extending on the surface of the one side of the plate-like portion to an edge of the plate-like portion, and the first opposing conductor portion and the linking conductor portion may be formed of a second metal film from the surface of the other side of the elastic body to an edge of the plate-like portion, with the first metal film and the second metal film being connected at the edge of the plate-like portion. With this construction, it is possible for the two metal films to form a conductor extending from the surface on one side to the surface on the other side.

Further, in this aspect, there may be formed a terminal formation body including a first plate-like portion, a second plate-like portion, and the terminal bridged therebetween and formed in a strip-like configuration; of the terminal formation body, the first plate-like portion may be bonded to the surface of the one side of the elastic body, and the terminal may be folded back at the edge of the elastic body, with the second plate-like portion being bonded to the surface of the other side of the elastic body. With this construction, by attaching the terminal formation body to the elastic member, it is possible to form a conductor extending from the surface on one side to the surface on the other side.

Further, in this aspect, a pad held in contact with the first flat circuit substrate may be formed on the surface of the first flat circuit substrate side of the plate-like portion. With this construction, it is possible to disperse the force received from the elastic body into the first flat circuit substrate via the pad.

In one aspect of the present invention, the thickness of the elastic member, connecting conductor portion, and first opposing conductor portion is larger than the distance between the circuit side conductor portion and the second opposing conductor portion when the first frame and the second frame are mated together. With this construction, the elastic member is compressed when the first and second connector frames are mated together, and hence it is possible to enhance the pressing force of the first opposing conductor portion and the second opposing conductor portion upon the intervening dielectric portion.

In another aspect of the present invention, the first frame is formed of a metal, and has a frame-like configuration that surrounds the elastic member. With this construction, the terminal is surrounded by the first metal frame and thus an electrical interference reducing effect is to be expected.

In yet another aspect of the present invention, an insulative planar member having a second terminal including the second opposing conductor portion is attached to the second frame, and the dielectric portion is formed as a thin film on the second opposing conductor portion. With this construction, the second terminal is formed on the insulative member, and hence, even when the formation of the dielectric portion involves a relatively high temperature, it is possible to form the dielectric portion on the second opposing conductor portion as a thin film.

Furthermore, in this aspect, the second connector frame may have, on either side of the portion to which the insulative member is attached, a mounting portion mounted to the second flat circuit substrate. With this construction, it is possible to disperse the force received by the insulative member from the elastic member into the second flat circuit substrate via the mounting portion, making it possible to suppress stress concentration at the portion where the insulating plate-like member is attached.

Additionally in this aspect, a pad coming into contact with the second flat circuit substrate may be formed on the second flat circuit substrate side of the insulative member. With this construction, it is possible to disperse the force received by the insulative plate-like member from the elastic member into the second flat circuit substrate via the pad.

In an aspect of the present invention, the elastic member is an elastic beam formed of a metal plate expanding along the second flat circuit substrate and capable of elastic deformation in an in-plane direction of the metal plate crossing the extending direction of the metal plate. With this construction, the elastic member is formed of a metal plate extending along the second flat circuit substrate, and hence it is possible to achieve a further reduction in connector height.

Further, in this aspect, at least a part of the elastic beam may be reduced in width toward the forward end. With this construction, it is possible to further enhance the force with which the elastic beam presses the detachment prevention portion.

Further, in this aspect, a part of the forward end portion of the elastic beam may extend in the pressing direction of the detachment prevention portion, with the forward end thereof pressing the detachment prevention portion. With this construction, it is possible to enhance the rigidity of the portion of the elastic beam which presses the detachment prevention portion.

Further, in this aspect, the second connector frame may have an opening against the inner peripheral edge of which the detachment prevention portion is pressed, and a part of the forward end portion of the elastic beam may be inserted into the opening, with the forward end thereof being opposed to the inner peripheral edge of the opening. With this construction, the forward end of the elastic beam and the inner peripheral edge of the opening are opposed to each other, and hence it is possible to align with each other the positions where the pressing force from the forward end of the elastic beam and the reaction force from the inner peripheral edge of the opening are exerted on the detachment prevention portion.

Further, in this aspect, the second connector frame may have an opening against the inner peripheral edge of which the detachment prevention portion is pressed, and the elastic beam may extend from the outer edge of the second connector frame toward the opening. With this construction, it is possible to secure the requisite extensions length for the elastic beam.

Further, in this aspect, the second connector frame may be formed of a metal plate expanding along the second flat circuit substrate, with a part of the metal plate being folded back to form the elastic beam. With this construction, a part of the metal plate forming the second frame is folded back to form the elastic beam, and hence it is possible to achieve a further reduction in connector height.

Furthermore, the second connector frame may have an opening against the inner peripheral edge of which the detachment prevention portion is pressed, and a part of the metal plate extending away from the opening may be folded back, forming the elastic beam extending from the outer edge of the second connector frame toward the opening. With this construction, it is possible to secure the requisite extension length for the elastic beam.

Further, in this aspect, parts of the metal plate extending in opposite directions may be folded back to form the two opposing elastic beams, with the detachment prevention portion being pressed by the two elastic beams. With this construction, it is possible to press the detachment prevention portion by using two elastic beams.

A plurality of conductive terminals are provided, and a plurality of the second opposing conductor portions opposed to the first opposing conductor portions of the terminals are provided, with a part of the first opposing conductor portions and the second opposing conductor portions being connected together, with no dielectric portion being therebetween. With this construction, it is possible to apply a part of the first opposing conductor portions and the second opposing conductor portions to some other use such as power supply.

Further, in this aspect, at least on one of a part of the first opposing conductor portions and the second opposing conductor portions, there may be formed a protrusion protruding toward the other. With this construction, it is possible to enhance the press-bonding force between the first opposing conductor portions and the second opposing conductor portions, which is suitable for use such as power supply.

The first frame has a detachment prevention portion extending toward the second frame side, and the second frame has an elastic member elastically deformable along the second flat circuit substrate and adapted to press the detachment prevention portion against some other portion of the second frame. With this construction, the elastic member for pressing the detachment prevention portion is elastically deformably formed along the second flat circuit substrate, and hence it is possible to achieve a reduction in height of the connector.

An opening may be formed in the second frame, and the elastic member may press the detachment prevention portion inserted into the opening against the inner peripheral edge of the opening. With this construction, the detachment prevention portion is inserted into the opening, and is pressed against the inner peripheral edge thereof, and hence it is possible to further enhance the detachment prevention effect.

The elastic member may be formed by a metal plate extending along the second flat circuit substrate and formed as an elastic beam capable of elastic deformation in an in-plane direction of the metal plate crossing the extending direction. With this construction, the elastic member is formed by a metal plate extending along the second flat circuit substrate, and hence it is possible to achieve a further reduction in height of the connector.

The second frame may be formed by a metal plate expanding along the second flat circuit substrate, with a part of the metal plate being folded back to form the elastic beam. With this construction, a part of the metal plate constituting the second frame is folded back to form an elastic beam, and hence it is possible to achieve a further reduction in height of the connector.

BRIEF DESCRIPTION OF THE FIGURES

The organization and manner of the structure and operation of the Present Invention, together with further objects and advantages thereof, may best be understood by reference to the following Detailed Description, taken in connection with the accompanying Figures, wherein like reference numerals identify like elements, and in which:

FIG. 1 is a side elevational view of a connector according to an embodiment of the present invention;

FIG. 2A is a perspective view of a first assembly constituting a part of the connector;

FIG. 2B is front elevational view of the first assembly;

FIG. 2C is a bottom plan view of the first assembly;

FIG. 2D is a sectional view of the first assembly taken along lines 2D-2D of FIG. 2B;

FIG. 5B is a bottom plan view of the second assembly;

FIG. 6A is a perspective view of a second frame constituting a part of the second assembly;

FIG. 6C is a sectional view of the second frame;

FIG. 9A is a sectional view of FIG. 8A, taken along lines 9A-9A thereof;

FIG. 9B is an enlarged view of the end portion of FIG. 10;

FIG. 11A is a perspective view of a first assembly according to a modification;

FIG. 11B is a front elevational view of the first assembly of the modification;

FIG. 11C is a bottom plan view of the first assembly of the modification;

FIG. 11D is a sectional view of the first assembly of FIG. 11B, taken along lines 13F-13F thereof;

FIG. 12A is a perspective view of a terminal formation body constituting a part of a terminal holder according to a modification;

FIG. 13 is a perspective view of another embodiment of a terminal assembly constructed in accordance with the principles of the present invention;

FIG. 17A is an enlarged, detail sectional view of an end portion of the connector of FIG. 14;

FIG. 17B is a sectional view of a connector according to a modification.

DESCRIPTION OF THE PREFERRED EMBODIMENTS

Figure 3:
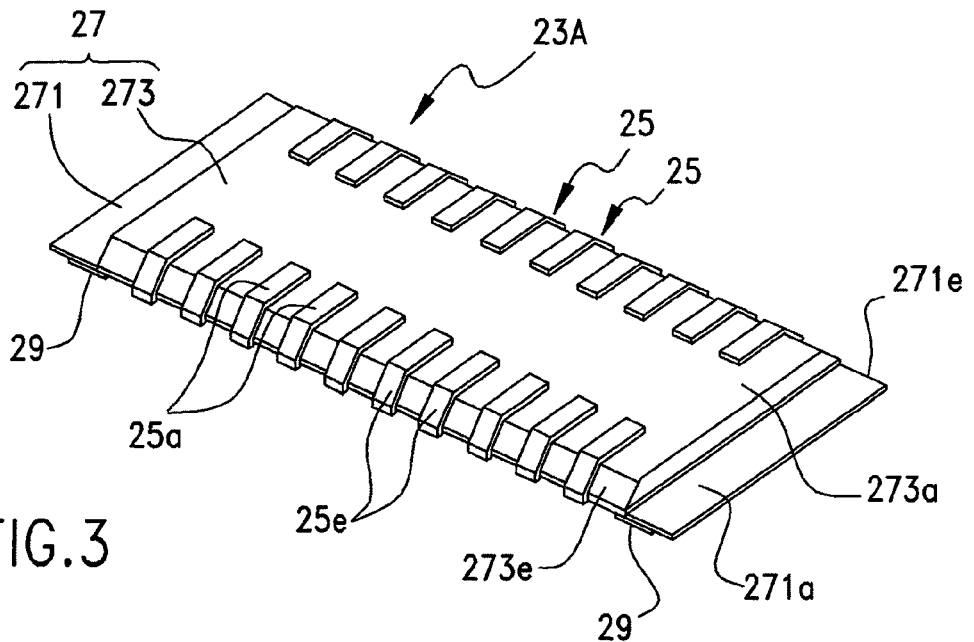
FIG. 3 is a perspective view of a terminal assembly used in the connector of FIG. 1.

While the Present Invention may be susceptible to embodiment in different forms, there is shown in the Figures, and will be described herein in detail, specific embodiments, with the understanding that the disclosure is to be considered an exemplification of the principles of the Present Invention, and is not intended to limit the Present Invention to that as illustrated.

In the embodiments illustrated in the Figures, representations of directions such as up, down, left, right, front, rear and the like, used for explaining the structure and movement of the various elements of the Present Invention, are not absolute, but relative. These representations are appropriate when the elements are in the position shown in the Figures. If the description of the position of the elements changes, however, it is assumed that these representations are to be changed accordingly.

FIG. 1 is a side view of a connector 1 constructed in accordance with the principles of the present invention. The connector 1 is shown mating together two circuit boards 7, 8 and includes a first assembly 2 (FIG. 2A) in which a terminal holder 23 that retains a plurality of first terminals 25 is attached to a flat first frame 21. It also includes a second assembly 3 (FIG. 5A) in which a terminal holder 33 that retains a plurality of second terminals 35 is attached to a flat second frame 31. The first assembly 2 is mounted to a first circuit board 7, and the second assembly 3 is mounted to a second circuit board 8. When joined together, the two circuit boards are in face-to-face relationship, and preferably are substantially parallel to each other In the connector 1, the first connector frame 21 and the second connector frame 31 are attached together, whereby the first circuit board 7 and the second circuit board 8 are connected together, and the first terminals 25 and the second terminals 35 sandwich dielectric portions 4 therebetween. As a result, the connector 1 functions as a connector performing signal transmission between the first circuit board 7 and the second circuit board 8 through capacitive-coupling, rather than galvanic contact.

In the embodiment to follow, circuit boards are used as examples of flat circuit substrate. However, other substrates such as a flexible printed circuit (FPC) may also be used. de.

As shown in FIGS. 2A through 2D, the first connector frame 21 is formed as a rectangular frame, and has a pair of long sides 212 and a pair of short sides 214, which all surround a rectangular opening 21h formed in the connector frame 21. The first connector frame 21 has extending portions 215 extending outwardly from the centers of the short side portions 214, and detachment prevention portions 216 bent and extending from the end portions thereof toward the front surface 2a side (the second frame 31 side). The detachment prevention portions 216 are used to attach the first and second connector frames 21, 31 together and their forward end portions 216a are bent somewhat outwardly into a hook-like shape. The first connector frame 21 is formed by performing a processing such as punching, bending or the like on a metal plate formed of stainless steel or the like.

The first connector frame 21 is fixed to the first circuit board 7 by bonding the long sides 212 and the extending portions 215 to the first circuit board 7. It is also possible for the long sides 212 and the extending portions 215 to be soldered to pads provided on the first circuit board 7.

A terminal holder, or assembly, 23A (FIG. 3) is arranged in the frame opening 21h and it includes an elongated elastic member 27, and a plurality of conductive first terminals 25 longitudinally arranged on both lateral sides of the elastic member 27. The elastic member 27 has an inner plate-like portion 271 formed by lamination of a resin sheet formed of polyimide or the like, and an elastic body 273 formed of silicone rubber or the like and bonded to a surface 271a of the plate-like portion 271. The elastic body 273 is also formed as a plate whose section taken in the lateral direction is trapezoidal, and the lower ends of edge portions (end portions) 273e in the lateral direction are aligned with an edge portion 271e of the plate-like portion 271.

In this case, the elastic body 273 is formed of silicone rubber or the like, and is stacked on the surface 271a of the plate-like portion 271, that is formed of polyimide or the like and which, while having flexibility, does not easily undergo elastic deformation in the in-plane direction, and hence elastic deformation in the in-plane direction is suppressed. In contrast, the elastic member 27 including the plate-like portion 271 and the elastic body 273 selectively exhibit elasticity, i.e., elastic deformation, in the thickness direction. Thus, it is possible to suppress positional deviation of first opposing conductor portion 25a and second opposing conductor portion 35a described below.

Figure 4A:
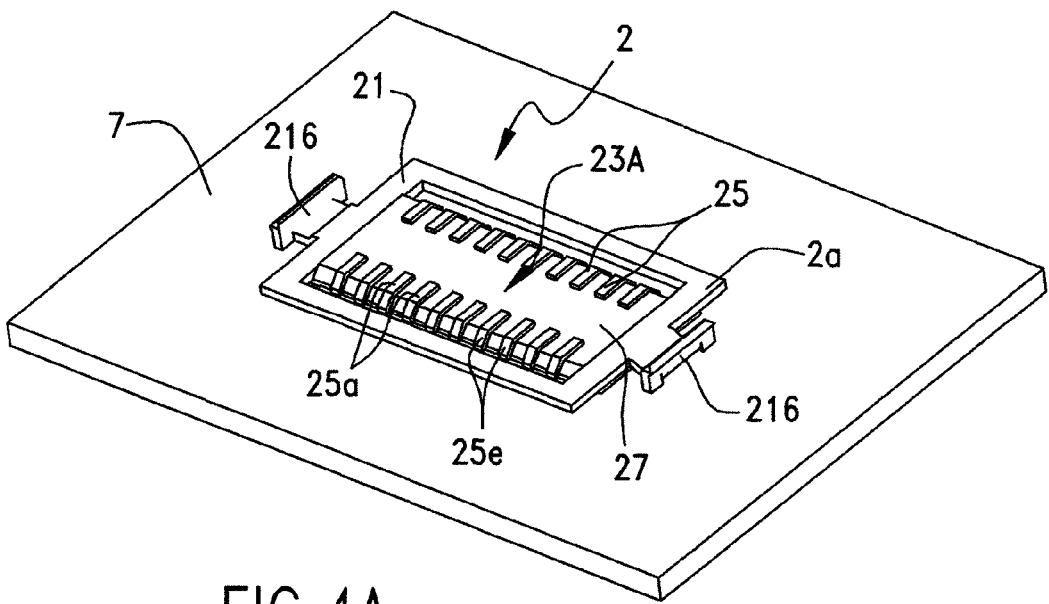
FIG. 4A is a perspective view of the first assembly as mounted on a circuit board.
Figure 4B:
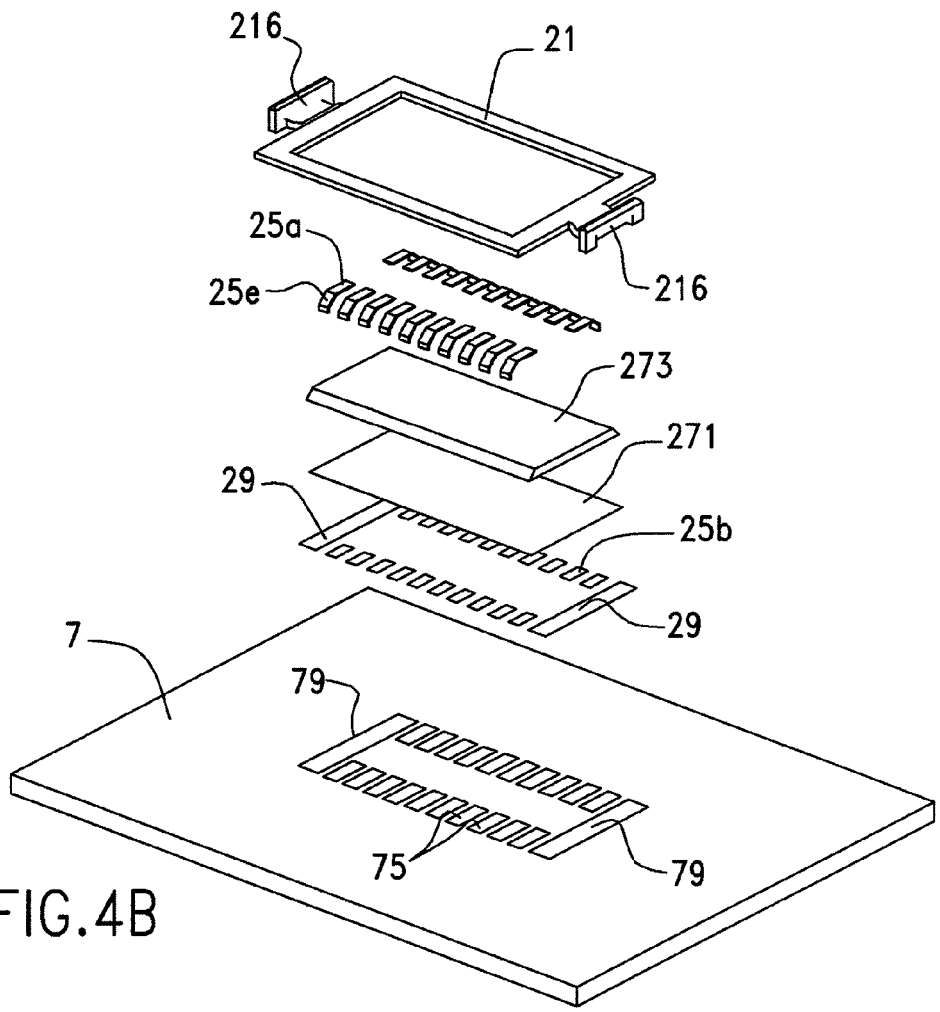
FIG. 4B is an exploded perspective view of FIG. 4A.

The elastic body 273 does not extend to the end portions of the structure in the longitudinal direction of the surface 271a of the plate-like portion 271, and these portions are bonded to the back sides of the short side portions 214 of the first frame 21 as shown in FIGS. 2B and 2C. Further, reinforcing metal contact pads 29 are formed on the back sides of these portions. As shown in FIG. 4B, the pads 29 correspond to pads 79 that are disposed on the surface of the first circuit board 7, and are brought into contact with these pads to thereby disperse the force from the elastic body 273.

As shown in FIGS. 2D and 3, the first terminals 25 extend from the top surface 273a of the elastic member 27 to the bottom surface 271b along the side edges 273e, 271e so as to hold the top and bottom surface 273a, 271b of the elastic member 27. More specifically, the first terminals 25 have connecting conductor portions 25b formed on the bottom 271b of the plate-like portion 271, first opposing conductor portions 25a formed on the top 273a of the elastic body 273, and linking conductor portions 25e formed at the side edge portions 271e, 273e of the plate-like portion 271 and the elastic body 273 and linking the first opposing conductor portions 25a and the connecting conductor portions 25b with each other.

In this case, the linking conductor portions 25e link the first opposing conductor portions 25a and the connecting conductor portions 25b via the edge portions 271e, 273e, and hence the first opposing conductor portions 25a and the connecting conductor portions 25b are capable of relative movement in the thickness direction according to the elasticity of the elastic body 273. Further, as shown in FIG. 4B, the connecting conductor portions 25b are connected by soldering or the like to terminals (circuit side conductor portions) 75 electrically continuous with the circuit provided on the circuit board 7. Further, as described below, the first opposing conductor portions 25a of the first frame terminals are arranged so that they are opposed to the second opposing conductor portions 35b of the second frame terminals 35

In the first terminals 25, the formation of the connecting conductor portions 25b, and the formation of the first opposing conductor portions 25a and the linking conductor portion 25e are preferably conducted separately. More specifically, on the bottom 271b of the plate-like portion 271, a metal film covering the entire bottom 271b is selectively removed, whereby there are formed first metal films serving as the connecting conductor portions 25b extending to the edge portions 271e of the plate-like portion 271. This construction is that of a so-called flexible printed circuit board (FPC).

Through sputtering, evaporation or the like, there are formed second metal films serving as the first opposing conductor portions 25a and the linking conductor portions 25e extending from the front surface 273a of the elastic body 273 to the edge portion 273e of the elastic body 273 via the edge portion 271e of the plate-like portion 271. The first metal films and the second metal films are connected together at the edge portion 271e of the plate-like portion 271. With this construction, sputtering, evaporation or the like has only to be performed on the top 273a side of the elastic body 273, thus facilitating the production.

After the formation of the first and second metal films, plating is performed thereon, whereby the conductive continuity between the first metal films and the second metal films is enhanced. That is, the continuity between the first opposing conductor portions 25a, linking conductor portions 25e, and connecting conductor portions 25b are further enhanced.

The first terminals 25 are not restricted to the above-described form, and it is also possible for the linking conductor portions 25e to be formed through the plate-like portion 271 and the elastic portion 273. In order to allow relative movement in the thickness direction of the first opposing conductor portions 25a and the connecting conductor portions 25b, it is desirable to form the linking conductor portions 25e avoiding positions directly below them.

Figure 5A:
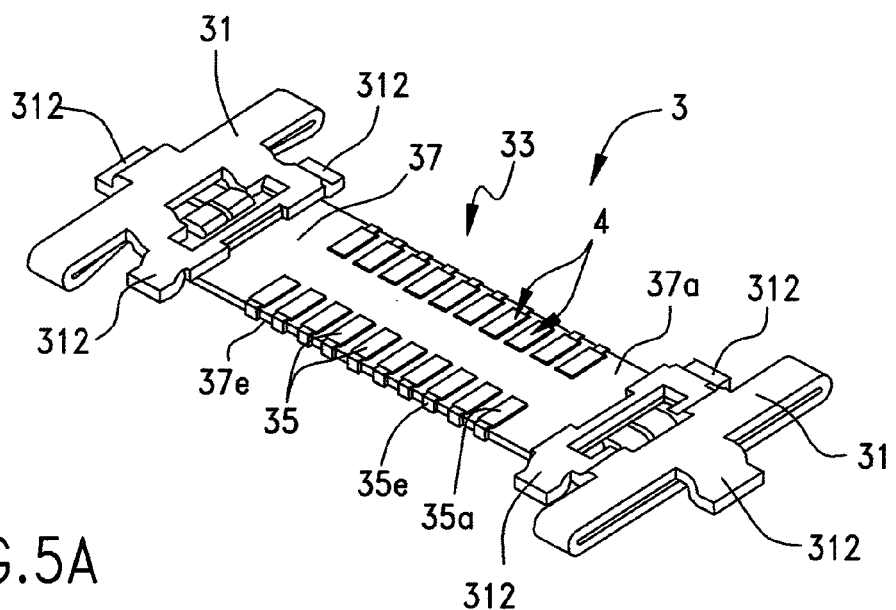
FIG. 5A is a perspective view of a second assembly constituting a part of the connector.

As shown in FIGS. 5A and 5B, in the second connector 3, between the second frames 31 provided at both longitudinal ends, there is supported an elongated terminal assembly 33 on which a plurality of conductive second terminals 35 are formed. The terminal assembly 33 has a plate-like insulating plate-like member 37 formed of an insulating ceramic material or the like, and a plurality of second terminals 35 arranged longitudinally on both lateral sides of the insulating plate-like member 37.

The second terminals 35 extend from the top 37a of the insulating plate-like member 37 to the bottom 37b thereof via an edge portion 37e so as to hold the top 37a and the bottom 37b of the insulating plate-like member 37. More specifically, the second terminals 35 have connecting conductor portions 35b formed on the back surface 37b of the insulating plate-like member 37, second opposing conductor portions 35a formed on the top 37a of the insulating plate-like member 37, and linking conductor portions 35e formed on the edge portion 37e of the insulating plate-like member 37 and linking the connecting conductor portions 35b and the second opposing conductor portions 35a.

Figure 8A:
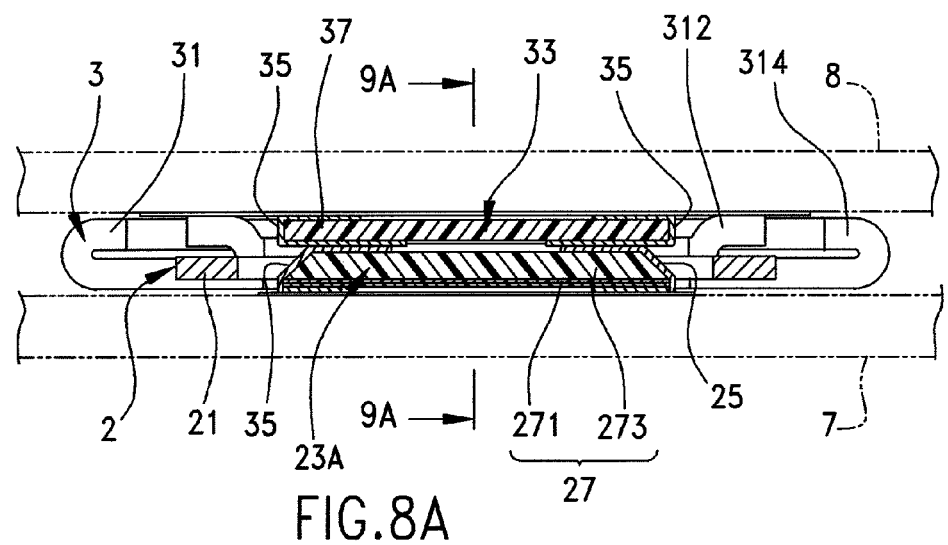
FIG. 8A is a sectional view of a connector according to an embodiment of the present invention.
Figure 8B:
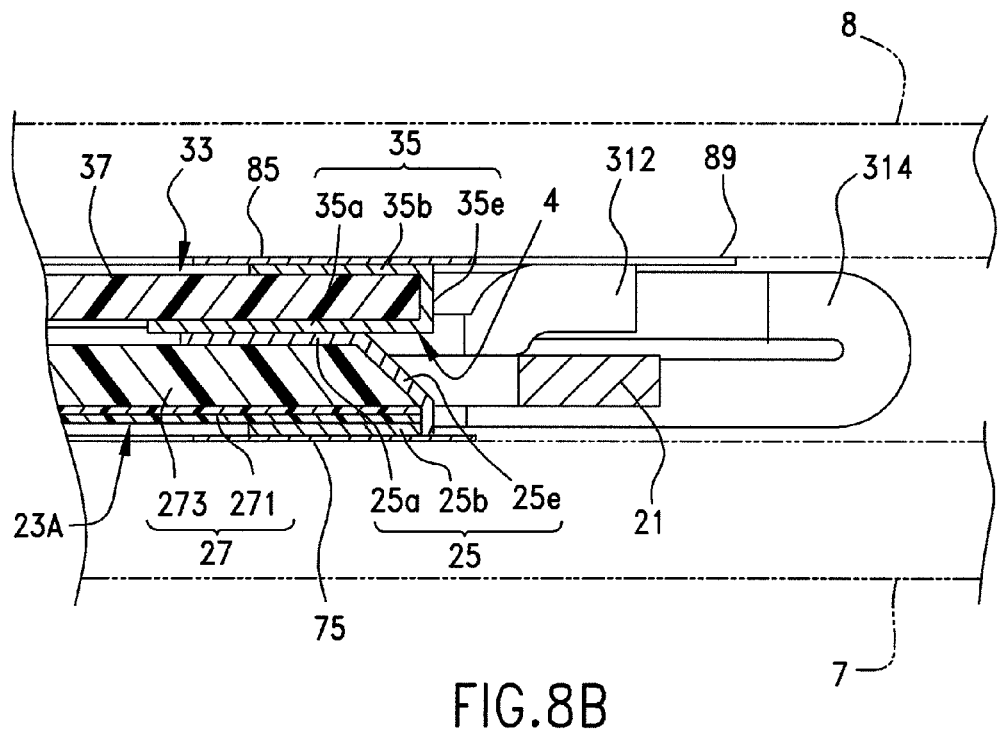
FIG. 8B is an enlarged view of the end portion of FIG. 8A.
Figure 10A:
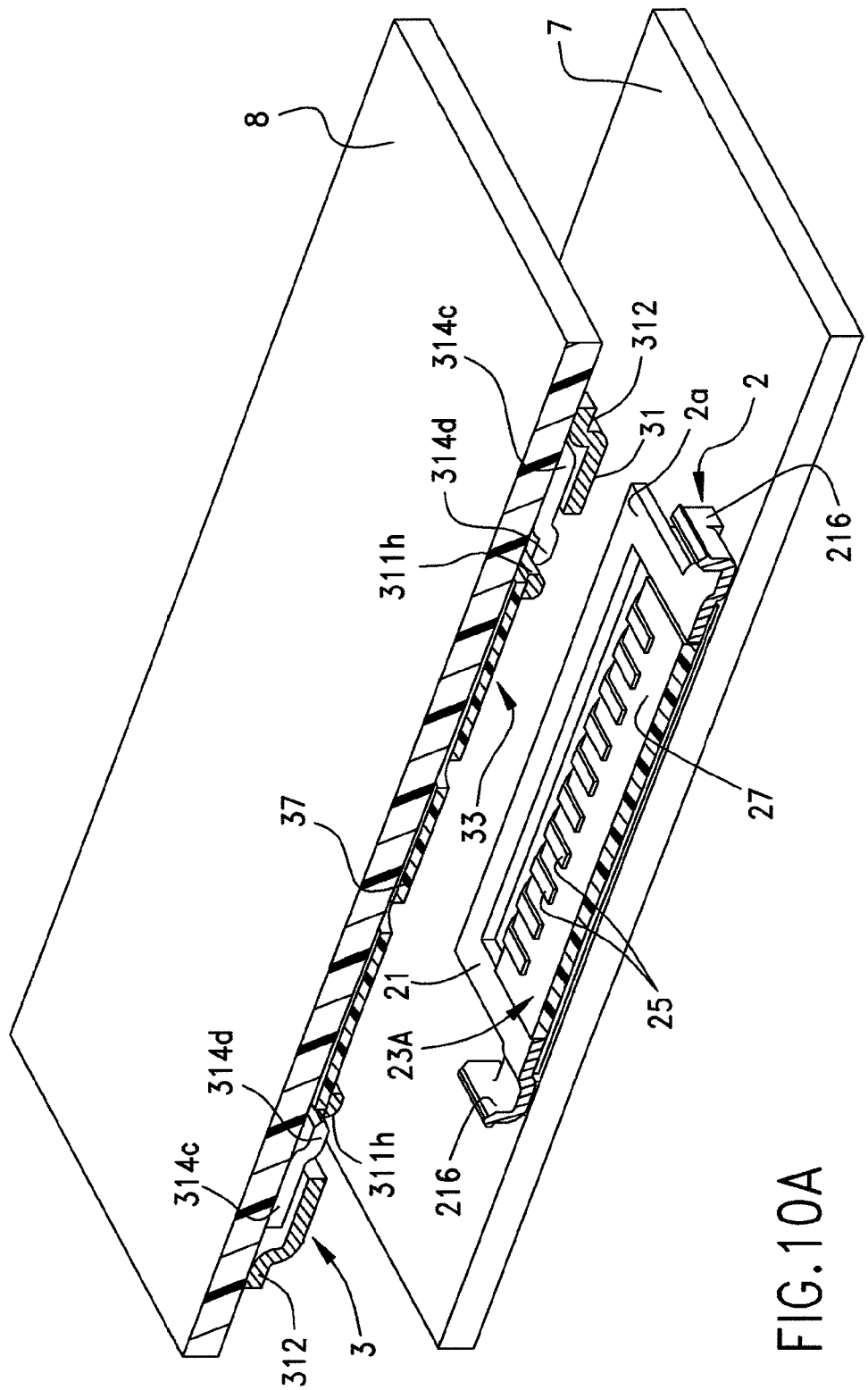
FIG. 10A is a sectional view of a connector according to the embodiment of the present invention.
Figure 10B:
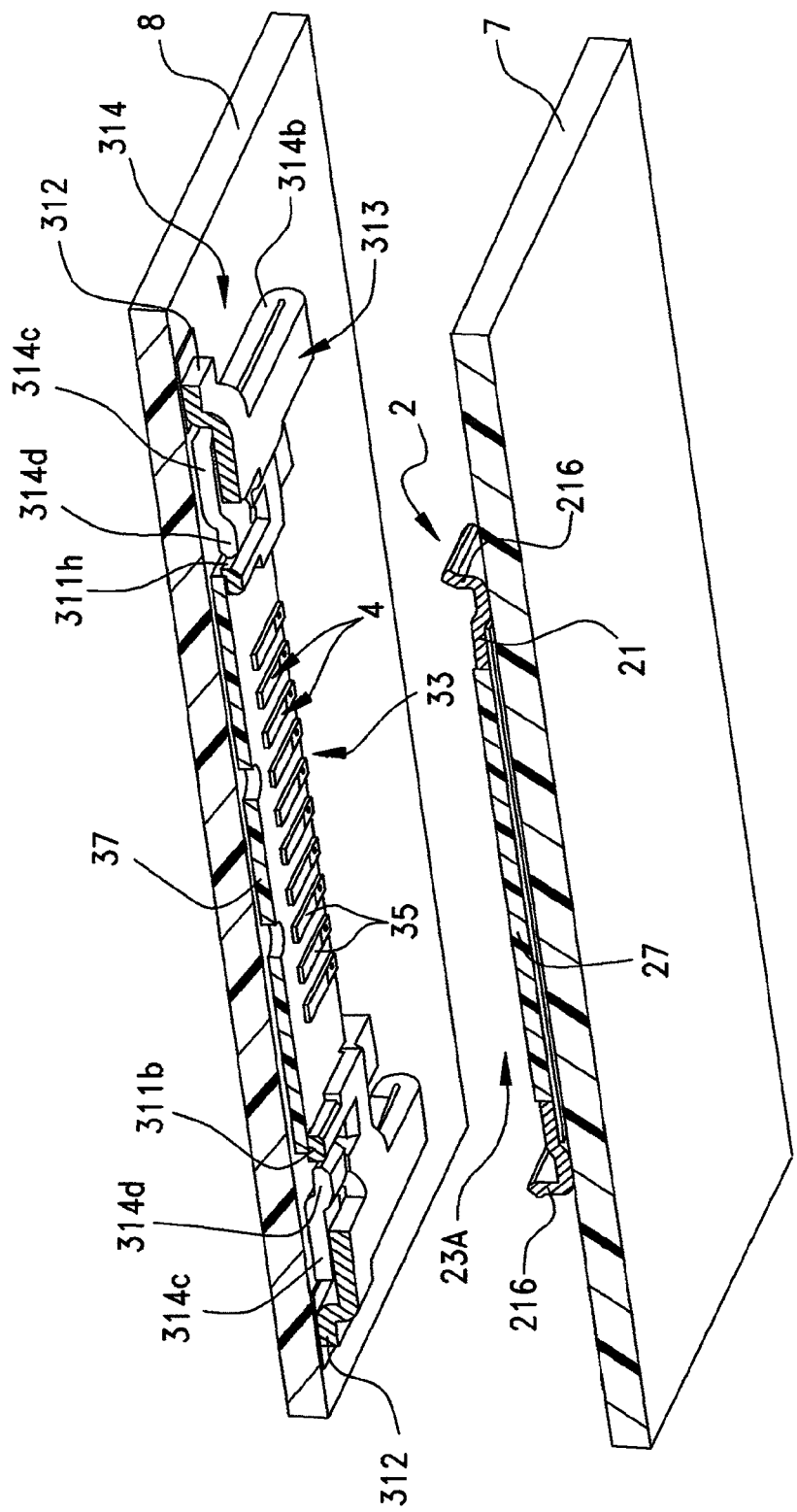
FIG. 10B is a sectional view of a connector according to the embodiment of the present invention.

In this case, as shown in FIG. 8B, the connecting conductor portions 35b are connected by soldering or the like to terminals (circuit side conductor portions) 85 electrically continuous with a circuit provided on the second circuit board 8. Further, as described below, the second opposing conductor portions 35a are opposed to the first opposing conductor portions 25b of the first terminals 25. It is also possible for the linking conductor portions 35e to be formed through the insulating plate-like member 37.

The dielectric portions 4 are formed on the second opposing conductor portions 35a of the second terminals 35. The dielectric portions 4 may be formed of a high dielectric ceramic material such as barium titanate, and are formed as thin films on the second opposing conductor portions 35a by sputtering. In this case, the second terminals 35 are formed on the insulating plate-like member 37 formed of a ceramic material or the like, and hence it is possible to form the dielectric portions 4 on the second opposing conductor portions 35a as thin films, with the heat involved at the time of sputtering constituting no obstacle. Alternatively, it is also possible to bond plate-like dielectric portions 4 to the second opposing conductor portions 35a.

Further, reinforcing metal pads 39 are formed at both longitudinal ends of the back surface 37b of the insulating plate-like member 37. As shown in FIG. 8B, the pads 39 correspond to pads 89 formed on the front surface of the second circuit board 8, and are brought into contact therewith, thereby dispersing the force from the elastic body 273.

Figure 6B:
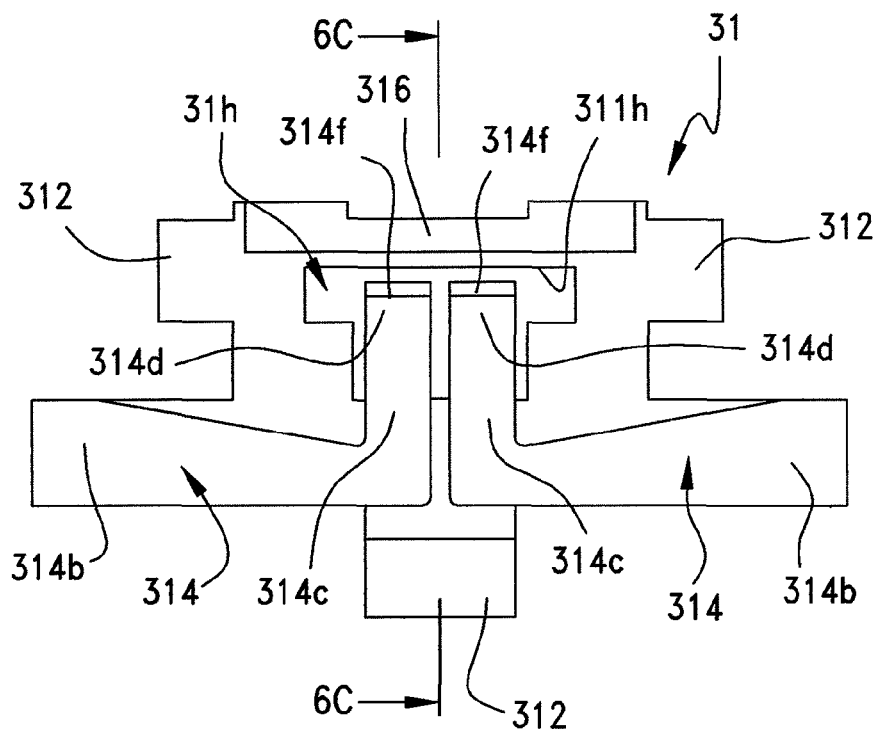
FIG. 6B is a bottom plan view of the second frame.
Figure 7A:
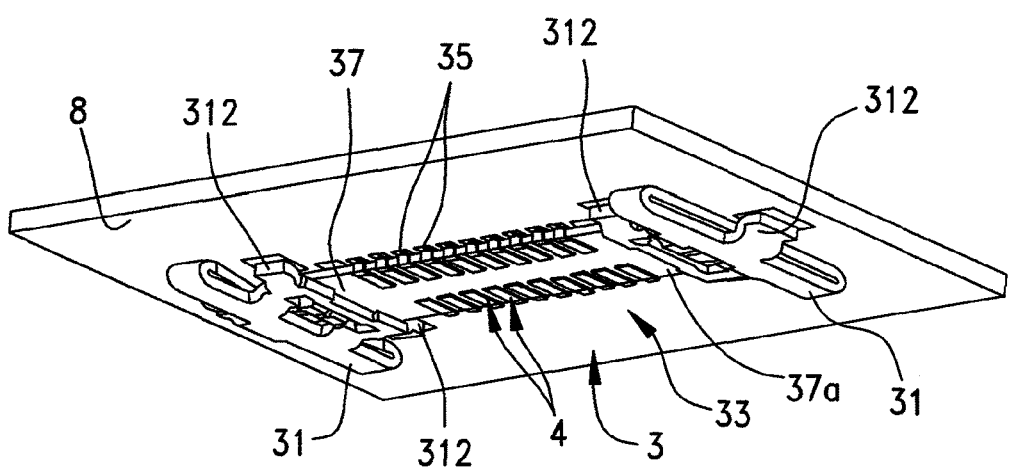
FIG. 7A is a perspective view of the second assembly as mounted on a circuit board.
Figure 7B:
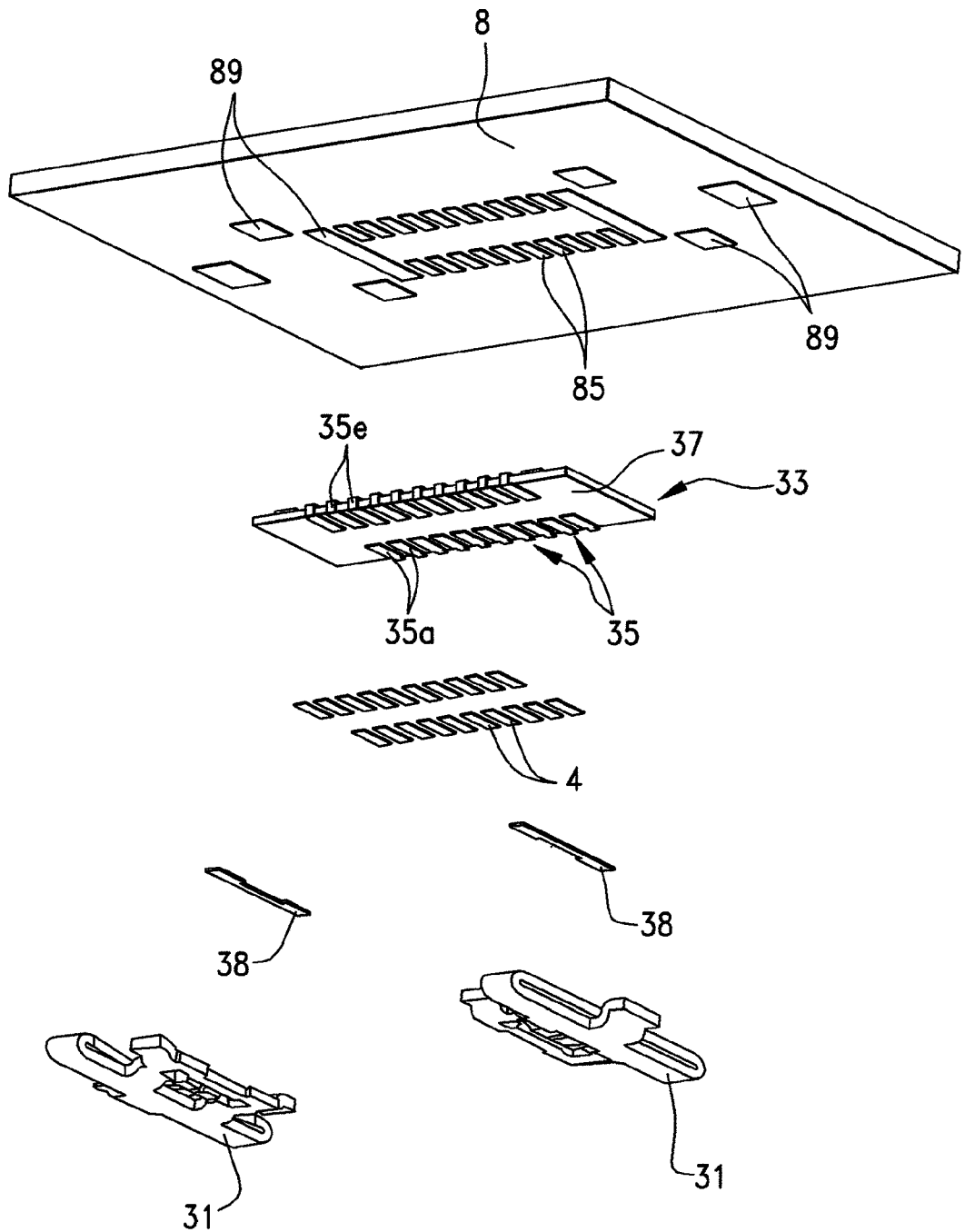
FIG. 7B in an exploded perspective view of FIG. 7A.

The second frame 31 shown in FIGS. 6A through 6C are formed by performing a processing such as punching, bending or the like on a metal plate formed of stainless steel or the like. On the bottom of the inner end portion in the longitudinal direction of the second frame 31 (the same longitudinal direction as in FIGS. 5A and 5B), there is formed a recess 316 for attaching the terminal holder 33. As shown in FIG. 7B, the terminal holder 33 is bonded to the recess 316 through the intermediation of adhesion paper sheets 38

The second frame 31 has an opening 31h at a position on the outer side in the longitudinal direction of the recess 316. A detachment prevention portions 216 formed on the first frame 21 is inserted into the opening 31h. The recess 316 side portion of the inner peripheral edge 311h of the opening 31h constitutes an opposing wall when the detachment prevention portions 216 is pressed by forward end portions 314d of an elastic beam 314 described below. The opening 31h is expanded longitudinally outwards with respect to the forward end portion 314d, whereby the movable range for the forward end portions 314d is secured. Further, the inner peripheral edge 311h of the opening 31h has a tapered surface 311h expanded toward the front side.

Further, the second frame 31 has, on both sides in the lateral direction, with the recess 316 and the opening 31h being held therebetween, mounting portions 312 bent in a step-like fashion toward the back side. As shown in FIG. 8B, the mounting portions 312 correspond to pads 89 formed on the connecting surface of the second circuit board 8, and are brought into contact with them, thereby dispersing the force from the elastic body 273.

The second frame 31 also has, on the outer sides in the longitudinal direction of the opening 31h, folded-back portions 313 formed by folding back toward the back side the portions of the metal plate forming the second frame 31 extending outwardly in the lateral direction. The back side portions of the folded-back portions 313 constitute elastic beams 314 for pressing the detachment prevention portions 216 formed on the first frame 21. The elastic beams 314 extend toward the center from the outer edge sides in the lateral direction. The outer edge sides formed by folding back the metal plate constitute fixed ends, and the forward ends extending toward the center constitute free ends, allowing elastic deformation in an in-plane direction (i.e., the longitudinal direction) crossing the extending direction.

Further, the extending portions 314b extending from the outer edge sides in the lateral direction of the elastic beams 314 toward the center are gradually reduced in width as they extend toward the forward ends, whereby the pressing force is properly applied to the detachment prevention portions 216. Further, at the forward ends of the elastic beams 314, there are formed pressing direction portions 314c extending in the pressing direction for the detachment prevention portions 216. The pressing direction portions 314c extend to positions in front of the inner peripheral edge 311h of the opening 31h constituting the opposing wall. As a result, the elastic beams 314 can hold the detachment prevention portions 216 with appropriate rigidity together with the inner peripheral edge 311h constituting the opposing wall.

As shown in FIG. 6C, the end portions 314d of the pressing direction portions 314c are bent in a step-like fashion toward the front side and inserted into the opening 31h, and are opposed to the inner peripheral edge 311h of the opening 31h. The detachment prevention portions 216 formed on the first frame 21 are pressed by the end portions 314d. Further, the end portions 314d are tapered in the pressing direction of the detachment prevention portions 216. Of these, the front side tapered surfaces 314e expand toward the top, together with the tapered surface 311e formed on the inner peripheral edge 311h of the opening 31h, whereby the detachment prevention portions 216 are guided therebetween. On the other hand, the bottom tapered surfaces 314f are of a configuration corresponding to the bent forward end portions 216a of the detachment prevention portions 216, whereby the detachment prevention portions 216 are caught by the end portions 314d.

Further, the second frame 31 has, at positions on the outer side longitudinal direction of the folded-back portions 313, mounting portions 312 bent in a step-like fashion toward the bottom. As shown in FIG. 8B, the mounting portions 312 are brought into contact with the pads 89 formed on the surface of the second circuit board 8. Further, the mounting portions 312 form gaps between themselves and the elastic beams 314, whereby securing the movable range for the elastic beams 314. The mounting portions 312 of the second frame 31 are soldered to the pads 89 provided on the second circuit board 8, whereby it is fixed to the second circuit board 8. It is also possible for the mounting portions 312 to be bonded to the second circuit board 8.

As shown in FIG. 9B, the first and second connector frames 21, 31 are attached together by inserting the detachment prevention portions 216 formed on the first connector frame 21 between the inner peripheral edges 311h of the openings 31h and the end portions 314d of the elastic beams 314 formed in the second connector frame 31. In this case, when the detachment prevention portions 216 are inserted between the inner peripheral edges 311h of the openings 31h and the end portions 314d of the elastic beams 314, they are guided by the tapered surfaces 311e, 314e provided thereon, and cause the end portions 314d of the elastic beams 314 to retreat. When the end portions 314d are caused to retreat, the elastic beams 314 generate a force (elastic force) pressing the detachment prevention portions 216. As a result, the forward end portions 216a of the detachment prevention portions 216 are engaged with the end portions 314d of the elastic beams 314, and the lower portions of the forward end portions 216a are pressed against the inner peripheral edges 311h of the openings 31h by the end portions 314d of the elastic beams 314, whereby the detachment prevention portions 216 are fixed in position.

And, as shown in FIGS. 8B and 9B, when the first frame 21 and the second frame 31 are thus attached together, the first opposing conductor portions 25a of the first terminals 25 and the second opposing conductor portions 35a of the second terminals 35 sandwich the dielectric portions 4 formed on the second opposing conductor portions 35a therebetween. The first opposing conductor portions 25a and the second opposing conductor portions 35a are pressed against the dielectric portions 4 by the elastic force of the elastic member 27. That is, the first opposing conductor portions 25a are pressed against the dielectric portions 4 by the elastic force of the elastic member 27, and the second opposing conductor portions 35a are pressed against the dielectric portions 4 by the reaction force thereof. As a result, it is possible to suppress the entrance of air, contaminants or the like between the first opposing conductor portions 25a and the dielectric portions 4, and to lessen the change in the overall capacitance between the first opposing conductor portions 25a and the second opposing conductor portions 35a. In this case, the thickness of the entire terminal holder 23A (that is, the thickness including the elastic member 27, the first opposing conductor portions 25a, and the connecting conductor portions 25b) is equal to or larger than the distance between the terminals 75 formed on the first circuit board 7 and the second opposing conductor portions 35a.

Figure 12B:
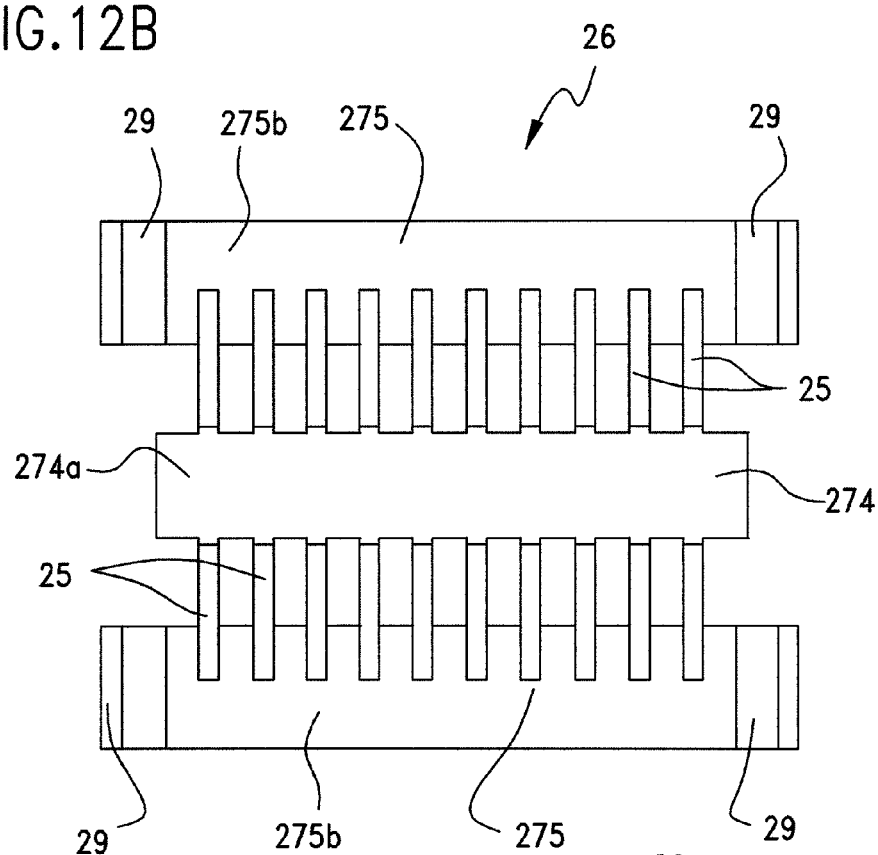
FIG. 12B is a top plan view of the terminal formation body of FIG. 12A.
Figure 12C:
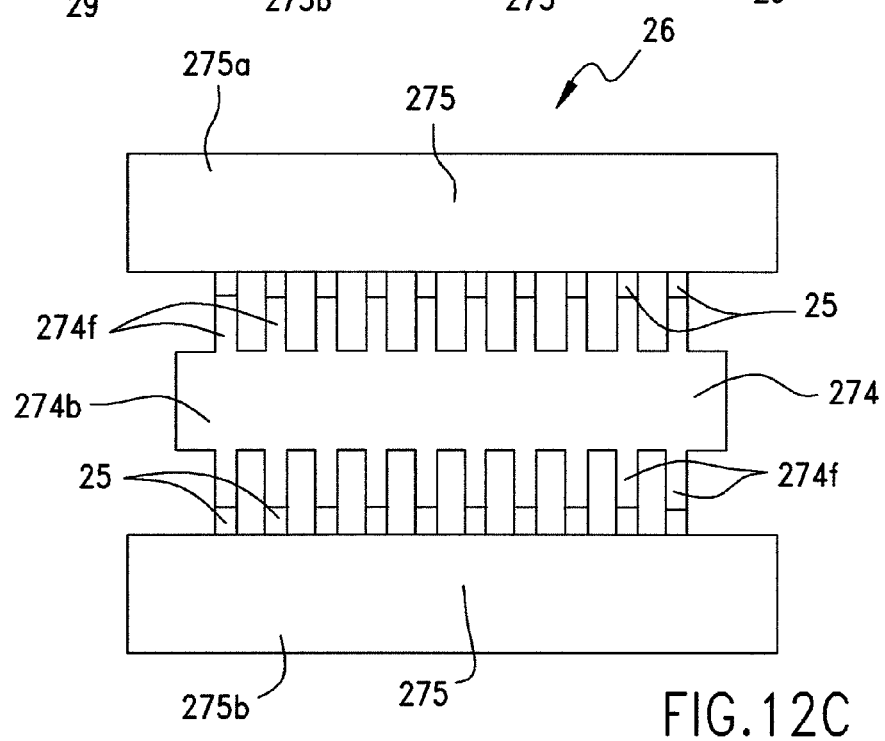
FIG. 12C is a bottom plan view of the terminal formation body of FIG. 12A.

A second embodiment of a terminal assembly 23B, is shown in FIGS. 12A-C and the assembly has a terminal formation body 26 attached to an elastic body 273 formed of silicone rubber or the like. The terminal formation body 26 has a first plate-like portion 274 and second plate-like portions 275 formed by resin sheets formed of polyimide or the like, and a plurality of first strip-like terminals 25 bridge therebetween. More specifically, on both lateral sides of the first plate-like portion 274, there are arranged the second plate-like portions 274 at a predetermined interval, and the first terminals 25 extend laterally from the first plate-like portion 274 to the second plate-like portions 275. The first terminals 25 are formed on terminal formation surfaces 274a, 275b of the first plate-like portion 274 and the second plate-like portions 275. Further, the first plate-like portion 274 has lining layers 274f lined with the first terminals 25 and extending together with them toward the second plate-like portions 275. Further, each second plate-like portion 275 has pads 29 on both longitudinal sides.

The terminal formation body 26 can be formed, for example, by performing selective etching of a resin layer and selective etching of a metal layer on a resin sheet one side of which is entirely covered with a metal film. That is, by performing selective etching of the resin layer, there are formed the first plate-like portion 274 and the two second plate-like portions 275, and the first terminals 25 and the pads 29 are formed by a process of selectively etching the metal film. That is, the terminal formation body 26 is formed as a so-called flexible printed circuit board (FPC).

As shown in FIG. 13, the terminal formation body 26 thus formed is attached so as to be wrapped around the elastic body 273. More specifically, the first plate-like portion 274 is bonded to the central portion in the lateral direction of the surface 273a of the elastic body 273, and the plurality of terminals 25 extending from the first plate-like portion 274 to the second plate-like portions 274 are folded back at the edge portion 273e of the elastic body 273, with the second plate-like portions 274 being bonded to the back surface 273b of the elastic body 273. In this way, by attaching the terminal formation body 26 to the elastic body 273, the plurality of first terminals 25 can be arranged, and hence the terminal holder 23B can be formed easily.

The terminal formation body 26 is wrapped around the elastic body 273 such that the terminal formation surfaces 274a, 275b of the first plate-like portion 274 and the second plate-like portion 275 are directed outwardly with respect to the elastic body 273. That is, the surfaces 274b, 275a of the first plate-like portion 274 and the second plate-like portion 275 on the side opposite to the terminal formation surfaces 274a, 275b are bonded to the elastic body 273. As a result, the terminal formation surface 274a of the first plate-like portion 274 constitutes the front surface of the terminal holder 23B, and the terminal formation surface 275b of the second plate-like portion 275 constitutes the back surface of the terminal holder 23B.

Further, of the first terminals 25 folded back at the edge portions 273e of the elastic body 273, their portions situated on the top 273a of the elastic body 273 constitute the first opposing conductor portions 25a, their portions situated at the edge portions 273e of the elastic body 273 constitute the linking conductor portions 25e, and their portions situated on the bottom 273b of the elastic body 273 constitute the connecting conductor portions 25b. In this case, as in the terminal holder 23A, the linking conductor portions 25e link together the first opposing conductor portions 25a and the connecting conductor portions 25b via the edge portions 273e of the elastic member 273, and hence the first opposing conductor portions 25a and the connecting conductor portions 25b are capable of relative movement in the thickness direction according to the elasticity of the elastic body 273. Further, unlike the above-described embodiment, in this modification, the terminal formation body 26 is formed as an FPC, whereby it is possible to form the first terminals 25 integrally.

Figure 14:
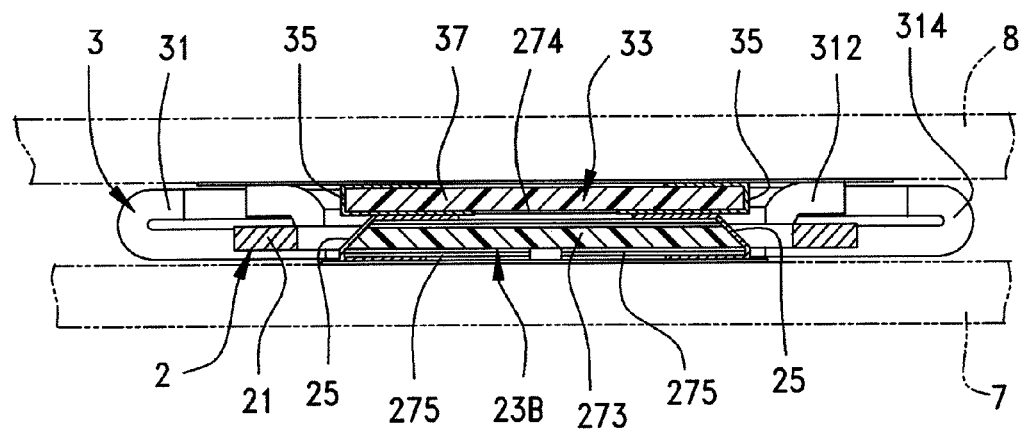
FIG. 14 is a sectional view of a connector utilizing the terminal assembly of FIG. 13.
Figure 15:
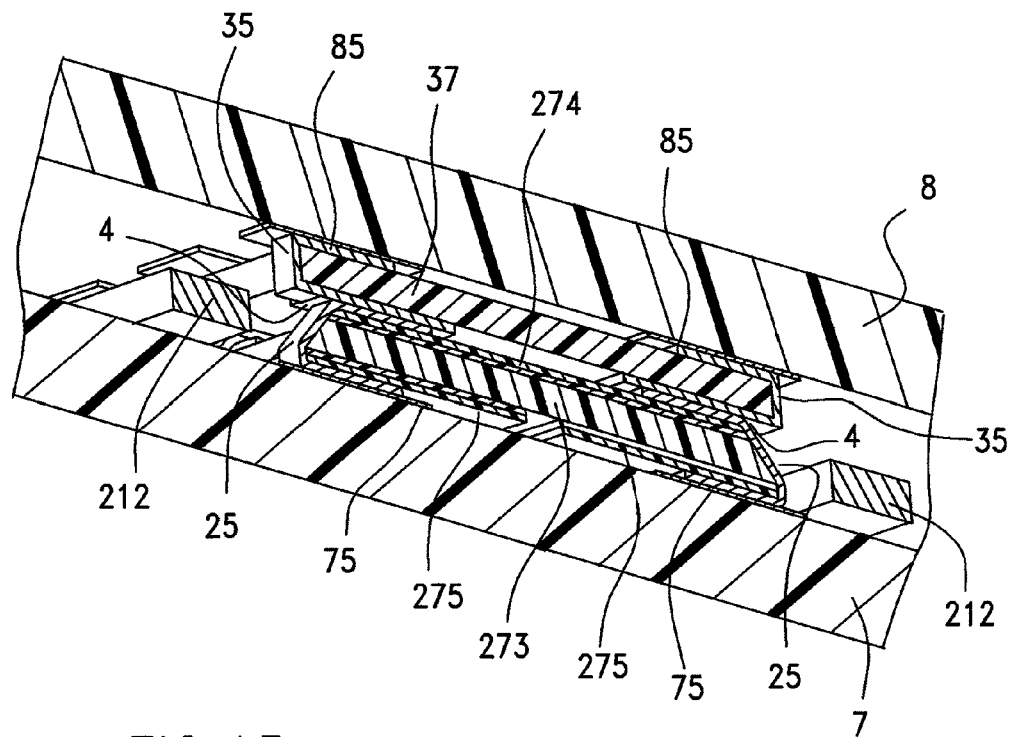
FIG. 15 is a sectional view of a connector of FIG. 14.

Further, in the terminal holder 23B thus formed, no elastic body 273 is formed at both longitudinal end portions of the surfaces 275a of the second plate-like portions 275, and, as shown in FIG. 13, these portions are bonded to the back side of the short side portions 214 of the first frame 21. As shown in FIGS. 14 and 15, when the first and second connector frames 21, 31 are attached together, the terminal holder 23B attached to the first frame 21 exerts an elastic force like the terminal holder 23A, making it possible to press the first and second opposing conductor portions 25a, 35a against the dielectric portions 4.

Figure 16A:
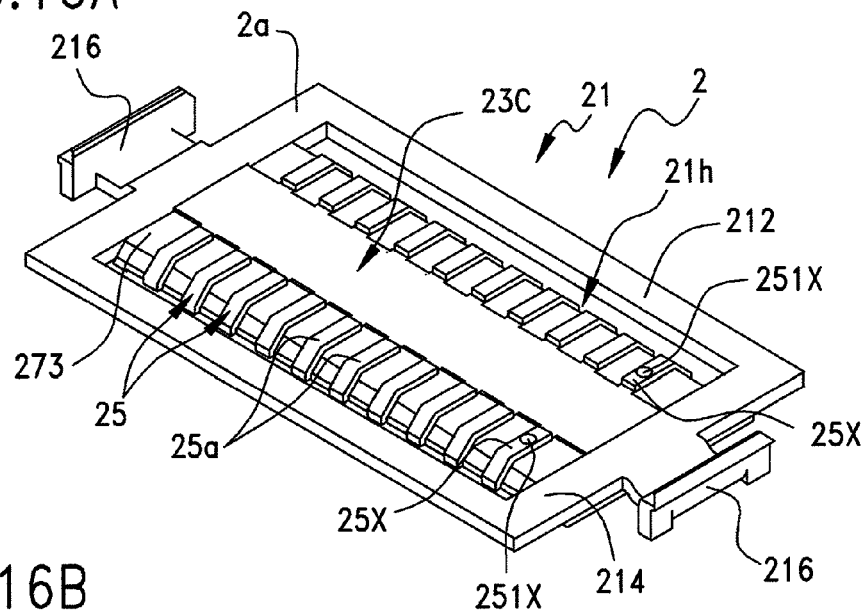
FIG. 16A is a perspective view of a connector frame used in an alternate embodiment of the invention.
Figure 16B:
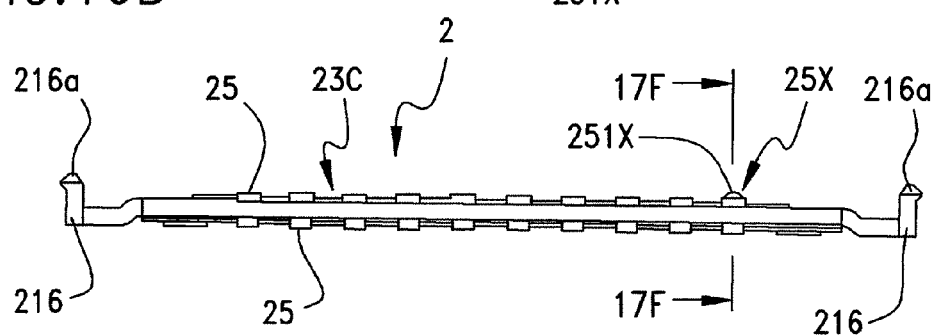
FIG. 16B is a front elevational view of the frame of FIG. 16A.
Figure 16C:
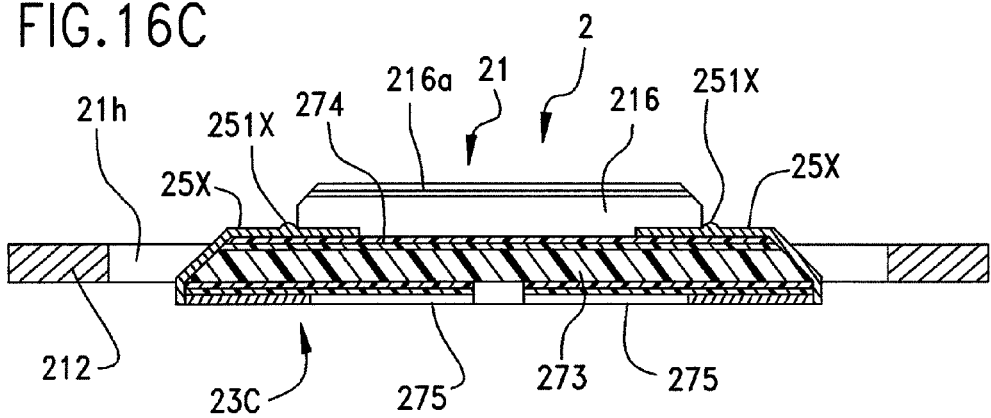
FIG. 16C is a sectional view of the frame of FIG. 16A.

Next, a third embodiment of a terminal assembly 23C is shown in FIGS. 16A-16C.

As shown in FIGS. 16A through 16C, in the terminal assembly 23C, a pair of first opposing conductor portions 25x of the plurality of first opposing conductor portions 25a have protrusions 251x protruding on the front side (the second opposing conductor portions 35a side). As shown in FIGS. 17A and 17B, of the plurality of second opposing conductor portions 35a, second opposing conductor portions 35x corresponding to the first opposing conductor portions 25x have no dielectrics portions 4. Thus, the first opposing conductor portions 25x and the second opposing conductor portions 35x are connected directly to each other with no dielectrics portions 4 formed therebetween. Further, since the protrusions 251x are provided on the first opposing conductor portions 25x, when the first and second connector frames 21, 31 are attached together, the amount by which the elastic member 27 is compressed by the first opposing conductor portions 25x is larger as compared with the case of the other first opposing conductor portions 25a. Thus, the resilient force of the elastic member 27 exerts on the first opposing conductor portions 25x is larger as compared with the case of the other first opposing conductor portions 25a. Thus, the press-fitting force between the first opposing conductor portions 25x and the second opposing conductor portions 35x is enhanced. As a result, it is possible to apply the first opposing conductor portions 25x and the second opposing conductor portions 35x to uses other than high-frequency use, such as power supply.

Further, the second connector frame 31 has, on both sides in the lateral direction, with the recess 316 and the opening 31h being held therebetween, mounting portions 312 bent in a step-like fashion toward the back side. As shown in FIG. 8B, the mounting portions 312 correspond to pads 89 formed on the surface of the second circuit board 8, and are brought into contact with them, thereby dispersing the force from the elastic body 273.

The second connector frame 31 has, at positions on the outer sides in the longitudinal direction of the opening 31h, folded-back portions 313 formed by folding back toward the back side the portions of the metal plate forming the second frame 31 extending outwardly in the lateral direction. The bottoms of the folded-back portions 313 constitute elastic beams 314 for pressing the detachment prevention portions 216 formed on the first frame 21. The elastic beams 314 extend toward the center from the outer edge sides in the lateral direction. The outer edge sides formed by folding back the metal plate constitute fixed ends, and the top ends extending toward the center constitute free ends, allowing elastic deformation in an in-plane direction (i.e., the longitudinal direction) crossing the extending direction.

Further, the extending portions 314b extending from the outer edge sides in the lateral direction of the elastic beams 314 toward the center are gradually reduced in width as they extend toward the forward ends, whereby the pressing force is properly applied to the detachment prevention portions 216. Further, at the forward ends of the elastic beams 314, there are formed pressing direction portions 314c extending in the pressing direction for the detachment prevention portions 216. The pressing direction portions 314c extend to positions in front of the inner peripheral edge 311h of the opening 31h constituting the opposing wall. As a result, the elastic beams 314 can hold the detachment prevention portions 216 with appropriate rigidity together with the inner peripheral edge 311h constituting the opposing wall.

The present invention is not restricted to the above-described embodiments but naturally allows those skilled in the art to make various modifications.

Figure 18:
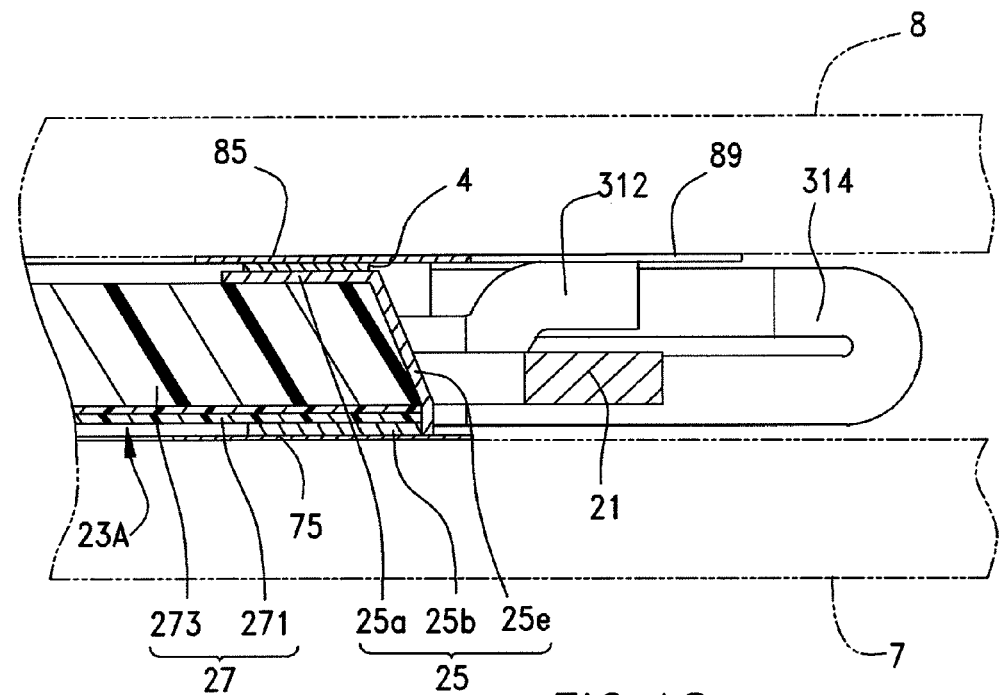
FIG. 18 is a sectional view of a connector according to a modification.

For example, as shown in FIG. 18, it is possible to omit the terminal holder 33 in the above-described construction, and to make the terminal assembly 23A so much the thicker, opposing the first opposing conductor portions 25a of the first terminals 25 to the terminals 85 formed on the surface of the second circuit board 8, with the plate-like dielectric portions 4 being sandwiched therebetween. In this case, the terminals 85 correspond to the "second opposing conductor portions".

Figure 19:
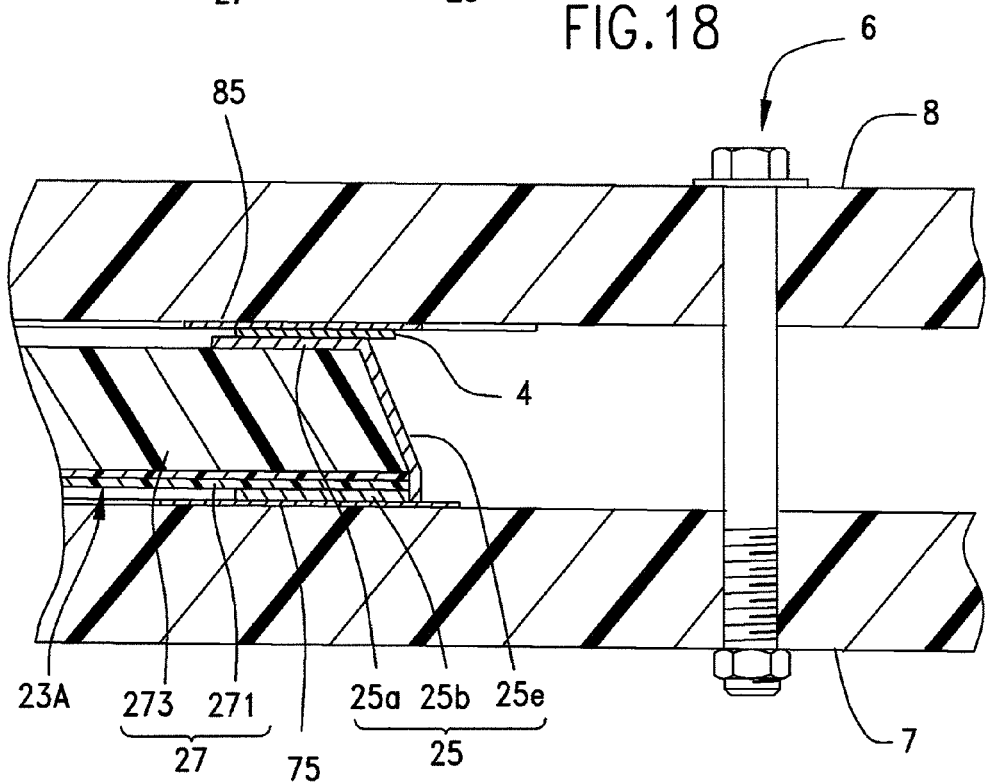
FIG. 19 is a sectional view of another mounting example of a terminal assembly used in another embodiment.

As shown, for example, in FIG. 19, it is also possible to provide the terminal assembly 23A and the plate-like dielectric portions 4 between the first circuit board 7 and the second circuit board 8, without using the first and second frames 21, 31, and to fix the first circuit board 7 and the second circuit board 8 together by fastening means 6 such as screws so as to press the terminal holder 23A. That is, the first opposing conductor portions 25a of the first terminals 25 and the terminals 85 formed on the surface of the second circuit board 8 are opposed to each other, with the plate-like dielectric portions 4 being sandwiched therebetween. In this case also, the terminals 85 correspond to the "second opposing conductor portions".

While a preferred embodiment of the Present Invention is shown and described, it is envisioned that those skilled in the art may devise various modifications without departing from the spirit and scope of the foregoing Description and the appended Claims.

What is claimed is:

1. A connector comprising:
    a first connector frame mounted to a first circuit substrate;
    a second connector frame mounted to a second circuit substrate;
    an elastic member positioned with respect to the first connector frame and having elasticity in at least one predetermined direction;
    at least one conductive terminal including a connecting conductor portion formed on one side in the one predetermined direction of the elastic member and connected to a circuit side conductor portion electrically continuous with a circuit provided on the first circuit substrate, a first opposing conductor portion formed on another side in the one predetermined direction of said elastic member and opposed to a second opposing conductor portion electrically continuous with a circuit provided on the second circuit substrate, and,
    a linking conductor portion linking the connecting conductor portion and the first opposing conductor portion so as to allow them relative movement in the one predetermined direction; and,
    a dielectric portion formed on at least one of the first opposing conductor portion and the second opposing conductor portion, and
    wherein, when said first and second connector frames are mated together, the first and second opposing conductor portions sandwich the dielectric portion therebetween.

2. A connector according to claim 1, wherein said elastic member is formed as a plate whose thickness direction is the one predetermined direction, and wherein the linking conductor portion links the connecting conductor portion and the first opposing conductor portion via an edge of said elastic member.

3. A connector according to claim 1, wherein said elastic member includes a plate-like portion whose thickness direction is the one predetermined direction, and a plate-like elastic body bonded to the plate-like portion.

4. A connector according to claim 3, wherein the connecting conductor portion is formed of a first metal film extending on a surface of the one side of the plate-like portion to an edge of the plate-like portion, and wherein the first opposing conductor portion and the linking conductor portion are formed of a second metal film extending from a surface of the another side of said elastic body to the edge of the plate-like portion, and wherein the first metal film and the second metal film are connected at the edge of the plate-like portion.

5. A connector according to claim 3, further including a terminal formation body including a first plate-like portion, a second plate-like portion, and the terminal formed as a strip bridged therebetween, and
wherein, of the terminal formation body, the first plate-like portion is bonded to the surface of the one side of said elastic body, said terminal is folded back at the edge of said elastic body, and the second plate-like portion is bonded to the surface of the another side of said elastic body.

6. A connector according to claim 3, wherein a pad held in contact with said first circuit substrate is formed on a surface of said first circuit substrate side of the plate-like portion.

7. A connector according to claim 1, wherein a thickness including said elastic member, the connecting conductor portion, and the first opposing conductor portion is larger than a distance between the circuit side conductor portion and the second opposing conductor portion when said first and second connector frames are mated together.

8. A connector according to claim 1, wherein said first frame is formed from a metal and has a frame-like configuration surrounding said elastic member.

9. A connector according to claim 1, wherein an insulating plate-like member on which a second terminal including the second opposing conductor portion is formed is attached to said second connector frame, and wherein said dielectric portion is formed as a thin film on said second opposing conductor portion.

10. A connector according to claim 9, wherein said second connector frame has a mounting portion mounted to said second circuit substrate on both sides of a portion to which the insulating plate-like member is attached.

11. A connector according to claim 9, wherein a pad held in contact with said second circuit substrate is formed on said second circuit substrate side of the insulating plate-like member.

12. A connector according to claim 1, further including a plurality of terminals and a plurality of second opposing conductor portions opposed to said first opposing conductor portions of said terminals, and wherein a part of said first opposing conductor portions and said second opposing conductor portions are connected together, with no dielectric portion therebetween.

13. A connector according to claim 12, wherein, on at least one of the part of said first and said second opposing conductor portions, there is formed a protruding portion protruding toward another.

14. A connector according to claim 1, wherein said first connector frame has a detachment preventing portion extending toward said second connector frame side, and
wherein said second connector frame has an elastic member formed so as to be capable of elastic deformation along said second circuit substrate and pressing the detachment preventing member against some other portion of said second connector frame.

15. A connector according to claim 14, wherein said second connector frame has an opening, and wherein said elastic member presses said detachment preventing member inserted into the opening against an inner peripheral edge of said opening.

16. A connector according to claim 14, wherein said elastic member is an elastic beam formed by a metal plate extending along said second circuit substrate and capable of elastic deformation in an in-plane direction of said metal plate crossing the direction in which said elastic member extends.

17. A connector according to claim 16, wherein said second frame is formed by a metal plate expanding along said second circuit substrate, with a part of said metal plate being folded back to form said elastic beam.

18. A terminal assembly, comprising:
an elastic member which has elasticity in at least one predetermined direction; and,
at least one terminal including a connecting conductor portion formed on one side in the one predetermined direction of the elastic member and connected to a circuit side conductor portion electrically continuous with a circuit provided on a first circuit substrate, a first opposing conductor portion formed on another side in the one predetermined direction of said elastic member and opposed to a second opposing conductor portion electrically continuous with a circuit provided on a second circuit substrate via a dielectric portion, and a linking conductor portion linking the connecting conductor portion and the first opposing conductor portion so as to allow them relative movement in the one predetermined direction;
wherein the terminal assembly is pressed from the one side to the another side such that the first opposing conductor portion and the second opposing conductor portion sandwich said dielectric portion therebetween.

19. A terminal assembly according to claim 18, wherein said elastic member is formed as a plate whose thickness direction is the one predetermined direction, and
wherein the linking conductor portion links the connecting conductor portion and the first opposing conductor portion via an edge of said elastic member.

* * * * *